(12) United States Patent
Prunnila et al.

(10) Patent No.: US 8,558,643 B2
(45) Date of Patent: Oct. 15, 2013

(54) MICROMECHANICAL DEVICE INCLUDING N-TYPE DOPING FOR PROVIDING TEMPERATURE COMPENSATION AND METHOD OF DESIGNING THEREOF

(75) Inventors: Mika Prunnila, Espoo (FI); Antti Jaakkola, Espoo (FI); Tuomas Pensala, Helsinki (FI)

(73) Assignee: Teknologian Tutkimuskeskus VTT, VTT (FI)

( * ) Notice: Subject to any disclaimer, the term of this patent is extended or adjusted under 35 U.S.C. 154(b) by 0 days.

(21) Appl. No.: 13/468,052

(22) Filed: May 10, 2012

(65) Prior Publication Data

US 2012/0286903 A1 Nov. 15, 2012

Related U.S. Application Data

(60) Provisional application No. 61/485,646, filed on May 13, 2011.

(30) Foreign Application Priority Data

May 13, 2011 (FI) ..................................... 20115465

(51) Int. Cl.
| | |
|---|---|
| H03H 9/24 | (2006.01) |
| H03H 3/013 | (2006.01) |
| H01L 29/06 | (2006.01) |
| H01L 21/00 | (2006.01) |

(52) U.S. Cl.
USPC ........... 333/186; 333/200; 333/234; 310/308; 257/28; 257/415; 257/418; 438/45; 438/50; 438/87; 438/381; 438/529; 438/549

(58) Field of Classification Search
USPC ................. 333/186, 188, 197, 199, 200, 234; 310/308, 309; 257/28, 414, 415, 417, 257/418; 438/45, 50, 52, 57, 87, 381, 421, 438/510, 527, 529, 549
See application file for complete search history.

(56) References Cited

U.S. PATENT DOCUMENTS

| | | | |
|---|---|---|---|
| 2003/0051550 A1* | 3/2003 | Nguyen et al. ............. | 73/514.36 |
| 2005/0195050 A1* | 9/2005 | Lutz et al. ..................... | 333/186 |

(Continued)

OTHER PUBLICATIONS

A.K. Samarao et al.; "Intrinsic Temperature Compensation of Highly Resistive High-Q Silicon Microresonators via Charge Carrier Depletion"; 2010 IEEE International Frequency Control Symposium, Jun. 1-4, 2010, pp. 334-339.*

(Continued)

*Primary Examiner* — Barbara Summons
(74) *Attorney, Agent, or Firm* — Thorpe North & Western LLP

(57) ABSTRACT

The invention relates to a micromechanical device comprising a semiconductor element capable of deflecting or resonating and comprising at least two regions having different material properties and drive or sense means functionally coupled to said semiconductor element. According to the invention, at least one of said regions comprises one or more n-type doping agents, and the relative volumes, doping concentrations, doping agents and/or crystal orientations of the regions being configured so that the temperature sensitivities of the generalized stiffness are opposite in sign at least at one temperature for the regions, and the overall temperature drift of the generalized stiffness of the semiconductor element is 50 ppm or less on a temperature range of 100° C. The device can be a resonator. Also a method of designing the device is disclosed.

30 Claims, 25 Drawing Sheets

(56) References Cited

U.S. PATENT DOCUMENTS

| | | | |
|---|---|---|---|
| 2006/0255881 A1* | 11/2006 | Lutz et al. | 333/186 |
| 2007/0188269 A1* | 8/2007 | Lutz et al. | 333/186 |
| 2007/0296527 A1* | 12/2007 | Lutz et al. | 333/186 |
| 2008/0007362 A1* | 1/2008 | Partridge et al. | 331/176 |
| 2011/0127625 A1* | 6/2011 | van der Avoort et al. | 257/418 |
| 2013/0099629 A1* | 4/2013 | Ayazi et al. | 310/346 |

OTHER PUBLICATIONS

M. Hovorka et al.; "Profiling N-Type Dopants in Silicon"; The Japan Institute of Metals 2010, Materials Transactions, vol. 51, No. 2 (2010), pp. 237-242, Special Issue on Development and Fabrication of Advanced Materials Assisted by Nanotechnology and Microanalysis, published Dec. 9, 2009.*

Hajjam, A. et al. "Sub-100ppb/[deg.]C temperature stability in thermally actuated high frequency silicon resonators via degenerate phosporous doping and bias current optimization" 2010 IEEE International Electron Devices Devices Meeting (IEDM 2010), Dec. 6-8, 2010.

Hajjam, A. et al. "Temperature compensated single-device electromechanical oscillators" IEEE 24th International Conference on Micro Electro Mechanical Systems (MEMS 2011), Jan. 23, 2011, published Mar. 17, 2011, pp. 801-804.

* cited by examiner

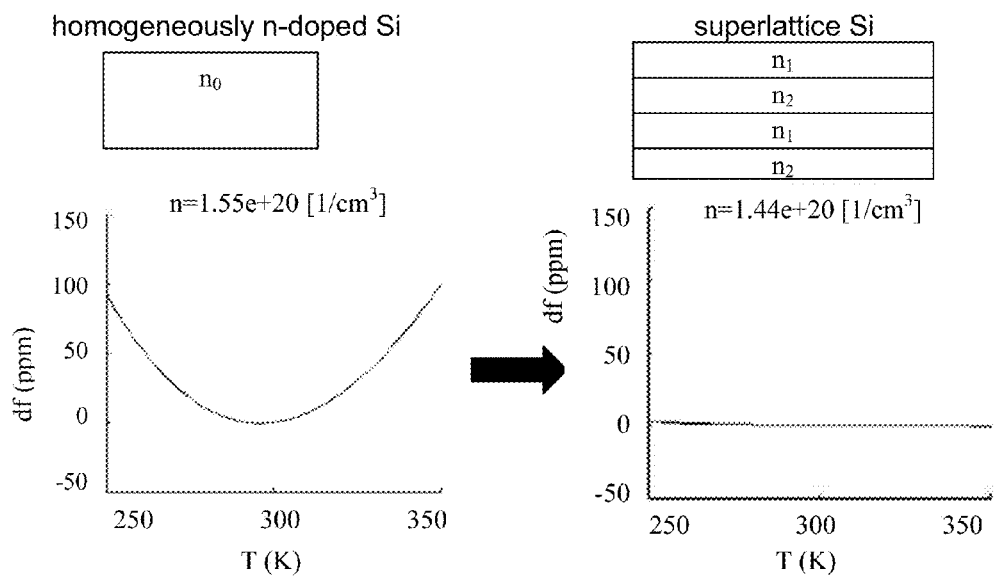
Fig. 1
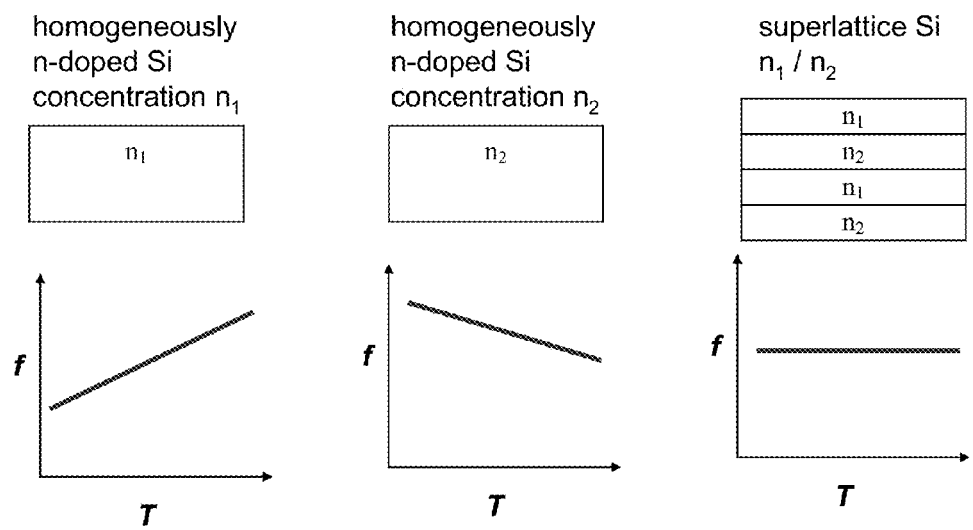
Fig. 2a  Fig. 2b  Fig. 2c

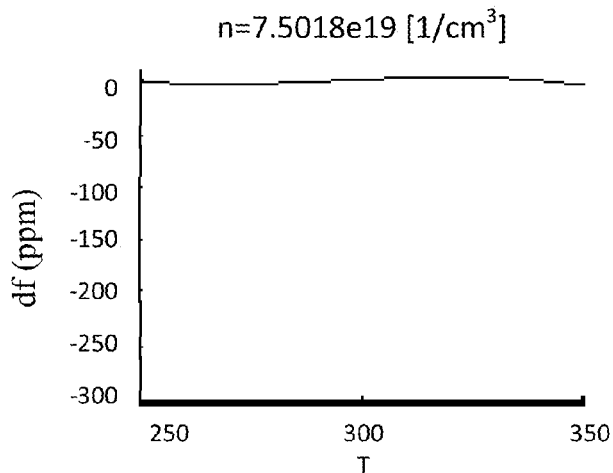
Fig. 7c
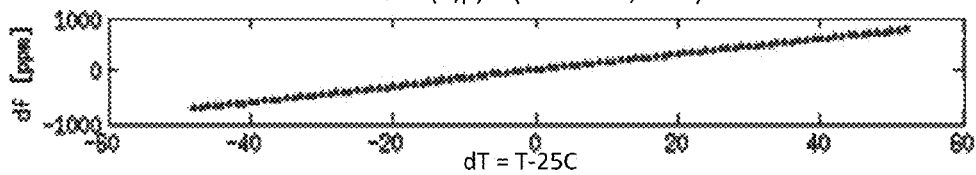
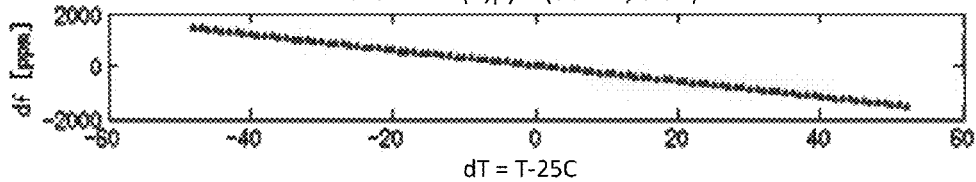
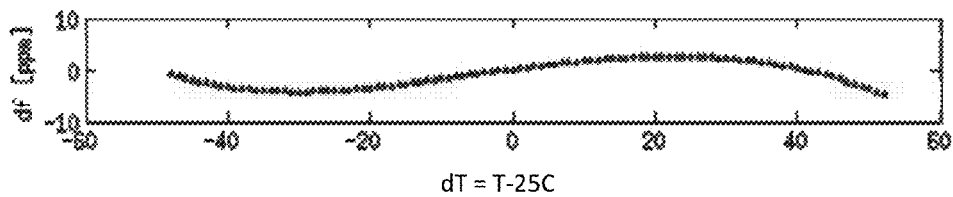
Fig. 7d

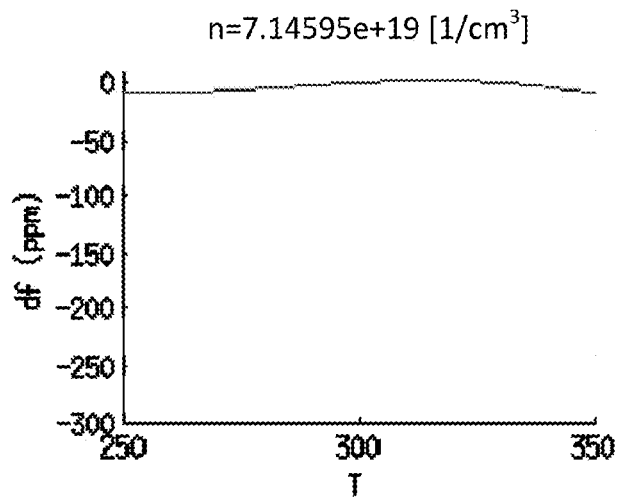
Fig. 8c
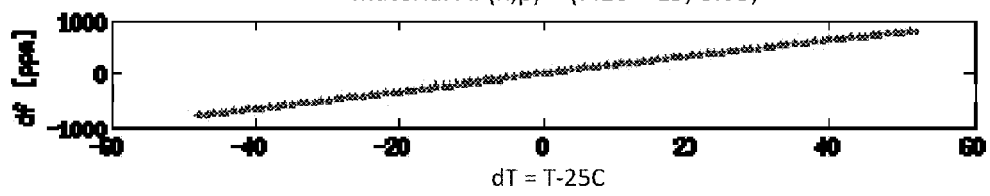
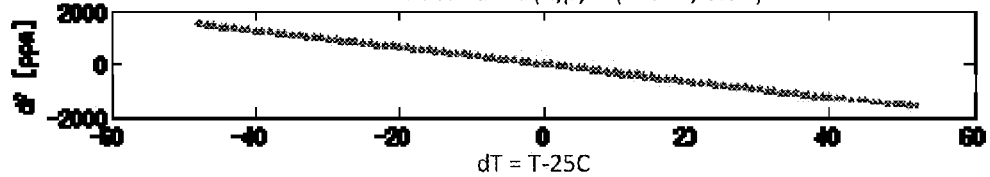
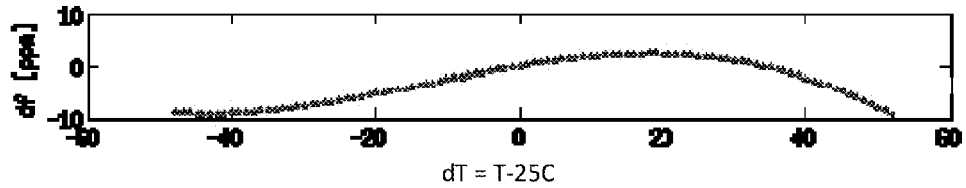
Fig. 8d df/f=0.16*dT + -0.0022*dT² - 7.2e-05*dT³ => total 10ppm on 100C range.

MICROMECHANICAL DEVICE INCLUDING N-TYPE DOPING FOR PROVIDING TEMPERATURE COMPENSATION AND METHOD OF DESIGNING THEREOF

FIELD OF THE INVENTION

The invention relates to temperature compensation of micromechanical devices, in particular resonators. The device and method according to the invention comprise the features of the preambles of the independent claims.

BACKGROUND OF THE INVENTION

Widely used quartz crystal based resonators can potentially be replaced by micromechanical, typically silicon-based resonators in many applications. Silicon resonators can be made smaller than quartz resonators and there are a plurality standard manufacturing methods for silicon resonators. However, a problem associated with silicon based resonators is that they have a high temperature drift of the resonance frequency. The drift is mainly due to the temperature dependence of the Young modulus of silicon, which causes a temperature coefficient of frequency (TCF) approx. −30 ppm/° C. This causes the resonance frequency to fluctuate due to changes in ambient temperature. MEMS resonators made of ordinary silicon have a temperature drift of approximately 3000 ppm on a 100° C. wide temperature range.

The large intrinsic temperature drift prevents silicon-based resonators from entering the quartz crystal dominated oscillator market. It is, however, known to compensate the temperature dependence in various ways. The prior art solutions include:

Active compensation with a temperature sensor and related electronic control circuitry, but it has not been possible to provide a resonator with sufficiently low temperature drift with low cost technology which would be suitable for mass production applications and would compete with quartz quality. Also, the use of a temperature compensation circuit increases the consumption of energy, which is a significant disadvantage especially in battery operated devices. Further, the compensation circuit tends to increase electric noise in the resonator circuit.

Active compensation by stabilizing the temperature of the resonator with temperature isolation and controlled warming/cooling of the resonator. However, this solution also increases the energy consumption of the device, and makes the device complicated to produce. The temperature compensation circuits are also slow in controlling, and cannot therefore compensate fast or large changes in ambient temperature sufficiently well.

Passive compensation by addition of amorphous $SiO_2$ exhibiting opposite sign of temperature drift to the structure. This technology is described in more detail e.g., in publication "Temperature compensation in silicon-based microelectromechanical resonators", F. Schoen et al (ISBN: 978-1-4244-2978-3/09) and International patent application PCT/FI2010/050744. Compensation by $SiO_2$ leads, however, to a more complex fabrication process and resonator performance trade-off Passive compensation by heavy p-type doping, such as boron doping, compensates strongly for $c_{44}$ characterized shear modes, like the Lamé mode, but less or not at all some other modes, limiting the applicability to quite special modes and excitation geometries in the case of piezoactuation. In particular, extensional modes are not well compensated by p-type doping. A homogeneously doped p-type silicon resonator has a temperature drift of about 300 ppm over a 100° C. range.

Passive compensation methods are discussed in not yet published Finnish patent applications 20105849, 20105851 and 20115151 of the same applicant, as well as references cited therein, in particular A. K. Samarao et al, "*Passive TCF Compensation in High Q Silicon Micromechanical Resonators,*" IEEE International Conference on Micro Electro Mechanical Systems (MEMS 2010), 2010, pp. 116-119; US 2010/0127596 and U.S. Pat. No. 4,719,383.

An article by A. K. Samarao et al., "*Intrinsic Temperature Compensation of Highly Resistive High-Q Silicon Microresonators via Charge Carrier Depletion*", Frequency Control Symposium (FCS), 2010 IEEE International, 1-4 Jun. 2010, pages: 334-339, discloses a bulk acoustic wave resonator comprising boron-doped (p-doping) silicon resonator element for reducing the temperature drift of the resonator. The boron-doped (p-doping) resonator element comprises, in addition, one or more layers of diffused phosphorus (n-doping) in order to create one or more pn-junction to the resonator element. The pn-junctions forming a depletion region with low charge carrier concentration have the effect that a local TCF of −3 ppm/° C. could be achieved.

Hajjam et al. "Sub-100 ppb/° C. Temperature Stability in Thermally Actuated High Frequency Silicon Resonators via Degenerate Phosphorous Doping and Bias Current Optimization", IEEE International Electron Device Meeting, December 2010, disclose also the possibility of n-type doping of silicon with phosphorus in order to further improve the TCF. They report a local temperature shift of 0.05 ppm/° C. in a thermally diffusion doped silicon resonator. Diffusion doping, however, results in a strong concentration gradient of charge carriers in the resonator and an n-dopant concentration of about $1*10^{19}$ cm$^{-3}$ or higher, which is shown later to be needed for efficient T-compensation, can be created only to a region penetrating to approximately 2 micron thickness from the surface of the device. Achieved concentration levels may be also dependent on the exact geometry of the device, which sets design constraints. Thus, there are severe limits for the design of the resonator with respect to its volume, thickness and availability of resonance modes, for example. For example, bulk acoustic wave modes are not effectively temperature compensated in diffusion doped resonators.

Known compensation techniques provide low temperature drift only over temperature ranges which are often too narrow for e.g. consumer electronics use.

Thus, there is a need for improved temperature compensated semiconductor resonators and other devices.

SUMMARY OF THE INVENTION

It is an aim of the invention to provide a novel temperature compensated semiconductor structure whose temperature sensitivity properties can be well managed not only locally, i.e. in a single temperature but over a wide temperature range, and a method for the manufacture thereof.

The aim is achieved by the invention as defined in the independents claims.

According to one embodiment, the micromechanical device comprises a semiconductor element anchored to a supporting structure so that it us capable of deflecting or resonating, the element comprising at least two types of regions having different material properties. The material properties and relative volumes of the materials define an effective material having the desired temperature compensation characteristics. In more detail, each of said regions comprise one or more n-type doping agents, the doping concentrations, doping agents and/or crystal orientations of the regions being configured so that the temperature sensitivities of the generalized stiffness are of opposite in sign at least at one temperature for the distinct regions, and the overall temperature drift of the generalized stiffness of the semiconductor element is 50 ppm or less on a temperature range of 100° C. This temperature range is typically centered around 25° C.

It has been found that it is possible to provide even devices in which the overall temperature drift of the generalized stiffness of the semiconductor element is 50 ppm or less on a temperature range of 300° C. or even wider ranges.

In addition, there is provided drive or sense means functionally coupled to said semiconductor element for actuating or sensing said resonance or deflection. There may also be both drive and sense means The term "temperature drift" (of generalized stiffness of the semiconductor element on/over a temperature range) is used so as to make a distinction to local measurement of the temperature sensitivity at one temperature only (usually expressed as TCF in units ppm/° C.). In the case of a resonator, the temperature drift of generalized stiffness equals twice the temperature drift of frequency of the resonator.

The term "generalized stiffness" is a function of the elastic parameters of the semiconductor material, i.e. parameters known as $c_{11}, c_{12}, c_{44}$ in the case of cubic crystals, like silicon crystals.

According to one embodiment, the regions having different material properties are distinct regions, which means that there is a sharp interface of material properties between the regions. According to another embodiment, the regions are formed by a continuous gradient of one or more material properties.

According to one embodiment, the temperature sensitivities of the generalized stiffness are of opposite generally throughout said temperature range, or at least on a majority thereof, for the distinct regions. That is, in a region or regions where one of the regions has a positive temperature coefficient, another region has a negative coefficient.

The temperature sensitivities may change in magnitude and in sign over the temperature range. It may be for example so that that the first region has a negative temperature sensitivity at a second temperature different from the first temperature, and said second region has a positive temperature sensitivity of the generalized stiffness at the second temperature.

According to a preferred embodiment the at least one first region and at least one second region comprise different doping concentrations of the one or more n-type doping agents. The different n-doping concentrations contribute to or entirely cause the difference in the temperature sensitivities.

According to one embodiment the at least one first region and at least one second region comprise different n-type doping agents. The different n-doping agents contribute to or entirely cause the difference in the temperature sensitivities.

According to one embodiment the at least one first region and at least one second region comprise different crystal orientations. The crystal orientations contribute to or entirely cause the difference in the temperature sensitivities.

According to one embodiment, the difference in the temperature sensitivities is a consequence of two or more of the abovementioned configurations.

According to one embodiment, the regions are configured so the overall temperature drift of the generalized stiffness of the semiconductor element is 10 ppm or less on a temperature range of 100° C.

The regions having different material properties are mechanically linked such that they form a resonator element, for example, whose overall temperature drift is different from the temperature drifts of each of the distinct regions. According to one embodiment, the regions are stacked on top of each other in a thickness direction of the semiconductor element. According to one embodiment the regions are arranged laterally, i.e. in width direction, with respect to each other in the semiconductor element. If there are more than two regions, also a combination of these approaches is possible.

According to one embodiment, the at least two region types are periodically repeated so as to form a superlattice structure. This means that there is sequence of regions which is found in two places of the resonator essentially in the same form. For example, in the case of two different types of regions A and B, there may be a stack ABAB. In the case of three different types of regions A, B and C, there may be a stack ABCABC.

According to one embodiment, the doping concentration in one region type is 5e19 cm$^{-3}$ or less in one and more than 5e19 cm$^{-3}$ (=5*10$^{19}$ cm$^{-3}$) in another region type.

According to one embodiment, the doping concentration in one region type is 2e19 cm$^{-3}$ or less in one and more than 2e19 cm$^{-3}$ in another region type.

According to one embodiment, the type of regions having a larger (the largest) n-doping concentration than the other of type (of all types) of said regions is provided in larger volume than the other type of regions.

According to one embodiment, the doping concentration of the type of regions having a larger (the largest) n-doping concentration than the other of type (of all types) of said regions forms at least 35% of the total volume of the semiconductor element.

In a particular embodiment the device comprises one region type with a doping concentration of 5e19-2e20 cm$^{-3}$, this region type amounting to 35-75% of the total volume of the resonating element, and another region type being non-doped or having a doping concentration of less than 2e18 cm$^{-3}$, this region type amounting to 25-65% of the total volume of the resonating element.

According to one embodiment, the n-doping concentration in each of the regions is essentially homogeneous.

According to one embodiment, the semiconductor element is a resonator element aligned with the crystal matrix of the semiconductor material such that the resonator exhibits a resonator mode whose modal frequency is dominated by the elasticity term ($c_{11}$-$c_{12}$) of the semiconductor materials of the resonator element. This expression means that no more than 20% of frequency contribution come from other terms (e.g. the $c_{44}$ term).

The regions may be e.g., epitaxially grown silicon layers (vertical stacking). According to one embodiment, the regions are trenches manufactured by trench refill process (horizontal stacking). According to one embodiment an implantation and annealing process is used. According to a still further embodiment, a wafer bonding technique is used. These techniques can be also combined in a suitable way for achieving the desired structure for the semiconductor element.

According to one embodiment, the device is a resonator, whereby the semiconductor element is a resonating element anchored to a supporting structure and the device comprises electrical drive means for exiting a resonance mode to the resonating element. The resonator may be used in various applications, for example those in which quartz resonators or other types of silicon resonators are presently used.

The drive or sense means may comprise e.g. piezoelectric drive or sense means arranged in mechanical contact with the semiconductor element. Electrostatic actuation can be used too.

If the drive and/or sense means has a significant contribution to the temperature sensitivity of the device, the doping concentrations or relative volumes of the region types are adapted so as to outcompensate the effects of the drive and/or sense means on the temperature sensitivity.

According to one embodiment, the present method for designing a micromechanical device comprises
  choosing a basic semiconductor material for the semiconductor element,
  choosing an n-dopant to be added to the semiconductor material,
  designing the inner structure of the semiconductor material,
wherein the designing of the inner structure comprises determining at least two n-dopant concentrations, types and/or crystal orientation of n-doped layers and their relative volumes in the distinct regions of the semiconductor element so that the drift of the temperature sensitivity of the generalized stiffness of the semiconductor element is less than 50 ppm, in particular less than 10 ppm on a temperature range of 100° C.

According to one embodiment, the resonator element comprises a crystal grown by Czochralski method, in which the one or more n-type doping agents is/are present already in the crystal growing stage. According to another embodiment, the resonator element comprises a crystal which is epitaxially grown with the one or more n-type doping agents is/are present already in the growing stage. Both these methods can be used to yield homogeneous doping of the crystal in each distinct region. Fabrication is straightforward e.g. by altering the amount of n-dopant deposited to each distinct region.

The invention offers significant advantages. The claimed structures have shown great potential in passive temperature compensation over wide temperature ranges. Not only the first order temperature coefficient, but also the higher order, in particular the second and, optionally, third order temperature coefficients are effectively compensated.

In particular, the configuration of the effective material can be designed such that the first and second order terms of the temperature coefficients of the different materials of the semiconductor element cancel each other to the claimed level. As shown by the examples and theory below, this results in a significant relative decrease in the overall temperature drift over a wide temperature range, compared with components of the effective material alone.

The whole resonator structure can be made of n-doped material without the need to use oxides, for example, which cause performance loss.

The invention can be applied at least for all many-valley semiconductor materials, of which n-doped silicon is one example.

Also, the structure can be implemented without p-dopants. Consequently, the presence of pn-junctions is avoided in the resonator.

Next, embodiments of the invention will be described in more detail with reference to the attached drawings.

BRIEF DESCRIPTION OF THE DRAWINGS

FIG. 1 shows how the temperature drift is changed if a homogeneously doped resonator is replaced with a superlattice.

FIG. 2a.c illustrate in more detail the temperature compensation principle with frequency vs. temperature graphs for two different n-dopant concentrations (n) and their superlattice configuration.

DETAILED DESCRIPTION OF EMBODIMENTS

Figure 3A:
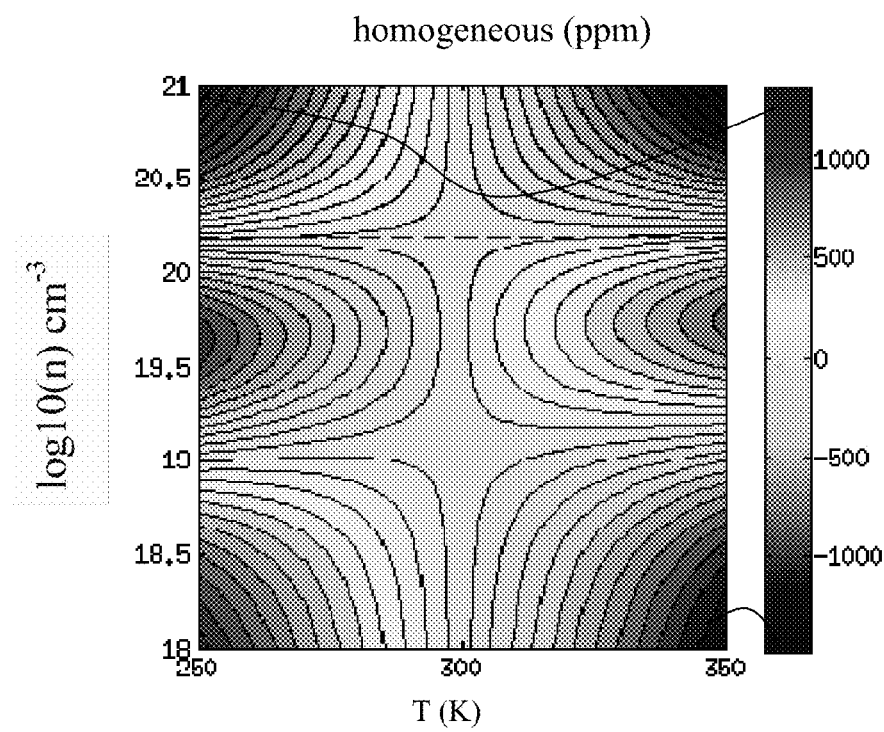
FIG. 3 illustrates, in the case of homogeneously doped resonator, (a) variation (in ppm) of the resonance frequency vs. dopant concentration as a contour plot, (b) the total frequency variation on a 100° C. temperature range vs. dopant concentration and (c) the frequency variation as a function of temperature at an optimal dopant density.

In the following description, an embodiment where the distinct regions of a semiconductor resonator element comprise different n-dopant concentrations, including some variations, are described.

In a simplified picture, the slope of resonator frequency vs. temperature, is positive or negative slope at each temperature point, depending on the dopant concentration. These effects can be combined to cancel each other not only in some points but on a wide temperature region, if the resonator is formed of an optimized effective material which comprises arbitrary lateral and/or vertical regions with different doping levels.

These regions do not have to be discrete: concentrations within the resonator body can also vary continuously within the resonator volume, and the same cancelling effect can be obtained.

According to one embodiment, the semiconductor element is a beam. The term "beam" generally refers to elements whose in-plane aspect ratio (width vs. length) is at least 5. Typically, the aspect ratio is at least 10.

According to one embodiment, the semiconductor element is a plate. The plate can be rectangular. For example, it may be a square plate. The plate can also be a polygonal, circular or elliptical. The aspect ratio of a plate (any lateral dimension vs. thickness) is less than 5.

According to one aspect, the device according to the device according to the invention comprises at least partly n-doped resonator element and comprising transducer means for exciting a resonance mode to the resonator element. The resonance mode may be one of the following:
  shear mode in a plate resonator element,
  square extensional (SE) mode in a plate resonator element,
  width extensional (WE) mode in a plate resonator element,
  flexural mode in a plate resonator element,
  extensional mode in a beam resonator element,
  flexural mode in a beam resonator element, or
  torsional mode in a beam resonator element.

According to one embodiment, the resonating element is adapted to be excited with the drive means to a Lamé mode, being a particular example of shear mode in a rectangular plate.

If the resonator element is a plate, it may be manufactured on a (100) wafer such that the sides of the plate coincide with the [100] directions of the crystal of the semiconductor material of the resonator element.

If the resonator element is a beam adapted to resonate in a torsional mode, it may be manufactured
  on a (100) wafer or on a (110) wafer, the main axis of the beam being oriented along the [110] direction of the semiconductor material, or on a (110) wafer so that the main axis of the beam is along a direction that is obtained by rotating the beam within the plane by 20-50 degrees from the [110] direction towards the [100] direction semiconductor material.

If the resonator element is a beam adapted to resonate in an extensional or flexural mode, the main axis of the beam can be oriented along the [100] direction of the semiconductor material.

These modes, suitable geometries and crystal orientations for them and their local temperature compensation are more specifically discussed in our previous application FI 20115151, the relevant parts of which are incorporated herein by reference.

According to one embodiment, the effective material comprises a vertical superlattice where silicon layers with different n-doping concentrations alternate. It has been shown that a drift of less than 10 ppm on a 100° C. wide temperature range can be reached with such configuration. An exemplary superlattice stack of silicon layers with alternating doping levels $n_1$ and $n_2$ is illustrated in the FIGS. 1 and 2c. Examples of resonance modes that can be compensated with this form of arrangement are the Lamé mode of a plate resonator and certain flexural/extensional and torsional modes of a beam resonator. A practical way to fabricate a vertical silicon superlattice is to grow silicon epitaxially on a substrate. The n-dopant concentration can be controlled during the growth, which produces a thickness dependent concentration profile.

Another practical way of forming a silicon superlattice is to wafer bond two silicon wafers having different n-dopant concentrations. The thicknesses of the bonded wafers should be controlled in such a manner that their proportions are correct for minimization of the frequency drift due to temperature.

In addition to epitaxy the different doping levels can be created by implantation and subsequent annealing. In this method top surface of a semiconductor is implanted with high dose of n-type dopants. Annealing step activates the dose and simultaneously drives the dopants deeper into the semiconductor. Thus, a vertical doping profile is created. By masking different regions before implantation this method can also give lateral profiles. This method can be combined with wafer bonding, which enables, for example, the bottom surface of active Si layer in silicon-on-insulator (SOI) wafer to have higher doping concentration than the top surface. Such structure can be further implanted from the top (and annealed) when the bottom and the top of the Si layer have higher doping and the middle lower doping.

The devices according to the invention can be actuated with drive, i.e., transducer means known per se. According to one embodiment the transducer means comprise a piezoelectric actuator element. According to another embodiment, the transducer means comprise electrostatic actuator means. More specifically these techniques are discussed in FI 20115151 and its sub-references.

Below some exemplary designs of a plate resonator in a Lamé mode and an example of a beam resonator is discussed in more detail.

Homogeneous Doping (Lamé Resonator)

Let us first investigate how the frequency of a homogeneously doped Lamé resonator behaves as a function of n-dopant density ($cm^{-3}$) and temperature (K). FIG. 3a shows the ppm variation of the resonance frequency as a contour plot (frequencies at T=300K have been as the reference for the ppm variation calculation, and the slope as a function of n has been removed from the plot).

One observes that there are two plateau regions: one at about log 10(n)=19, and the other log 10(n)=20.2. However, neither of these plateaus are "horizontal"—as a result the frequency changes as a function of temperature for all n-dopant densities n.

Figure 3B:
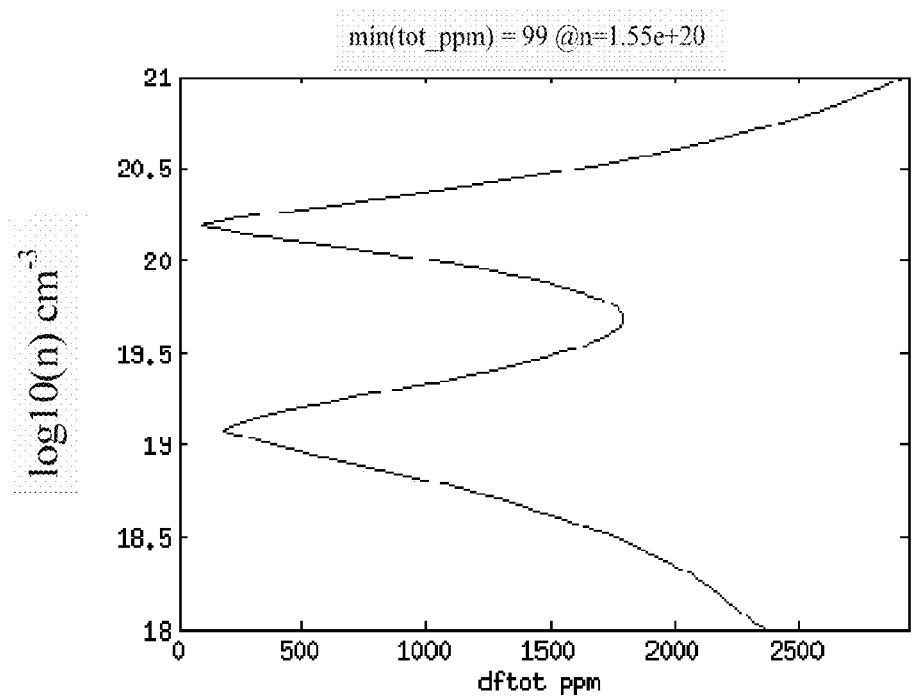

The total frequency variation on the whole temperature range T=250 . . . 350K at each n-dopant density is shown in FIG. 3b.

Figure 3C:
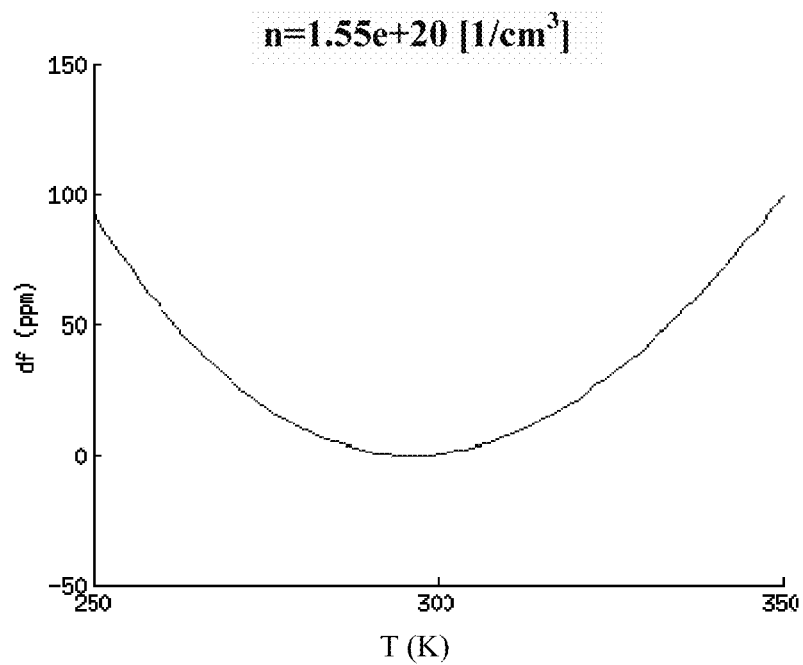

There are two minima corresponding the above mentioned plateaus. Minimum total frequency variation of 100 ppm over a 100° C. range is obtained at n=1.55e20 $cm^{-3}$. FIG. 3c shows the frequency variation as a function of temperature at the n-dopant density where the minimization occurs.

Superlattice Configuration Example 1

Plate Resonator in Lamé Mode

Figure 4A:
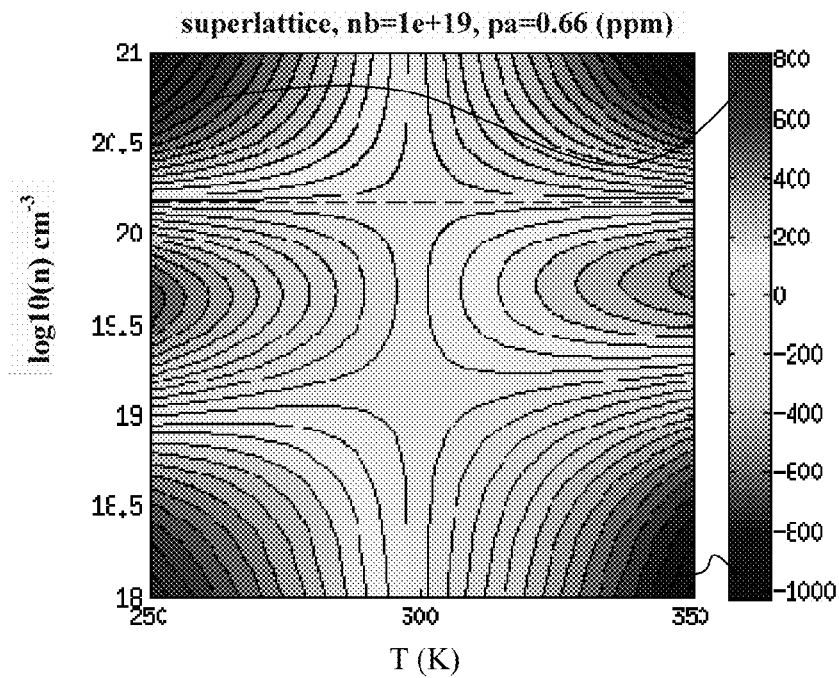
FIGS. 4-9 (a)-(c) show graphs corresponding to whose of FIGS. 3a-c for various configurations according to embodiments of the invention.
Figure 4B:
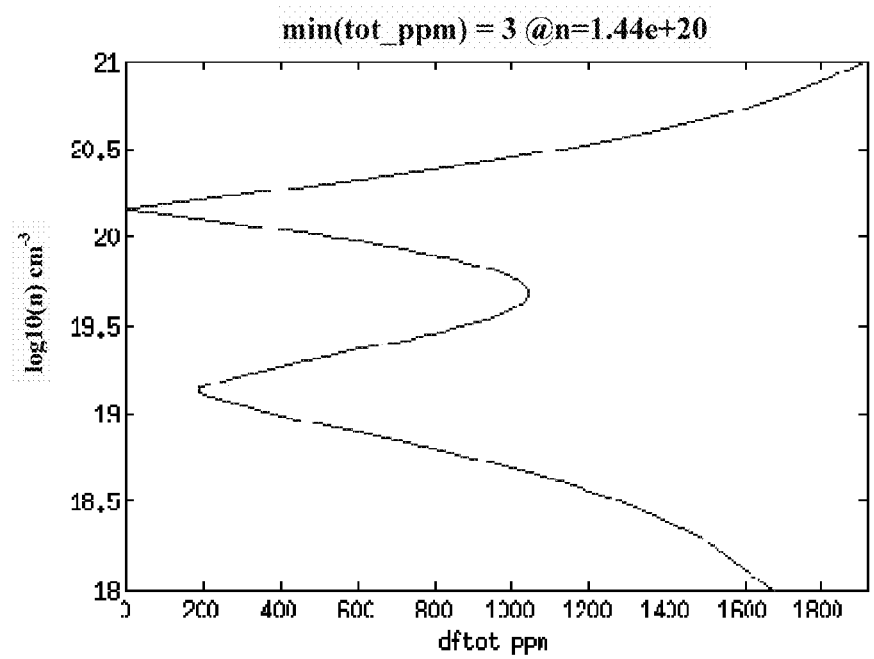
Figure 4C:
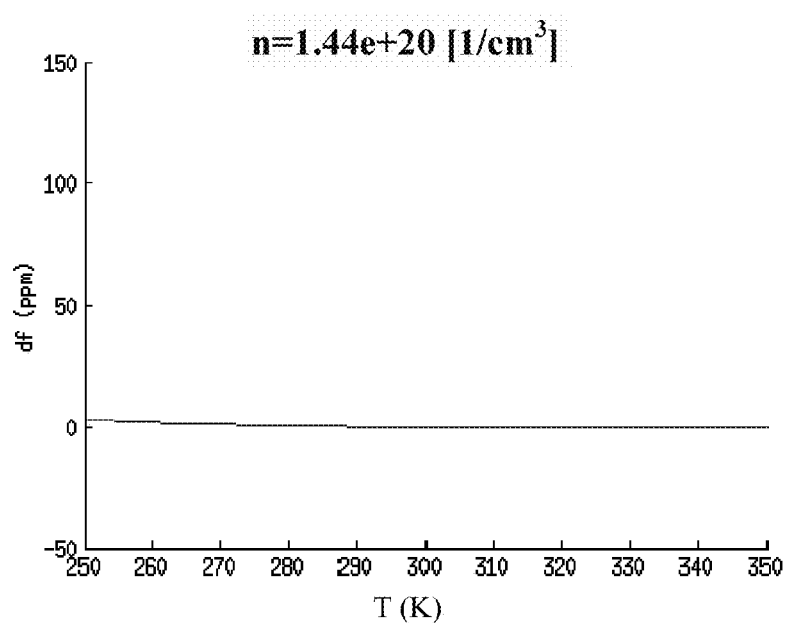

FIGS. 4a-4c show graphs corresponding to those of FIGS. 3a-3c but using an superlattice with the following design parameters:

$$n_a=1.44e20\ cm^{-3}, p_a=0.656 \text{(about 66\%)}$$

$$n_b=1e19\ cm^{-3}, p_b=0.344 \text{(about 34\%)}$$

where $n_i$ indicates the n-dopant concentration, and $p_i$ indicates the relative volume of material i. This configuration decreases the total frequency variation from 100 ppm to 3 ppm over a 100° C. range.

Superlattice Configuration Example 2

Plate Resonator in Lamé Mode

Figure 5A:
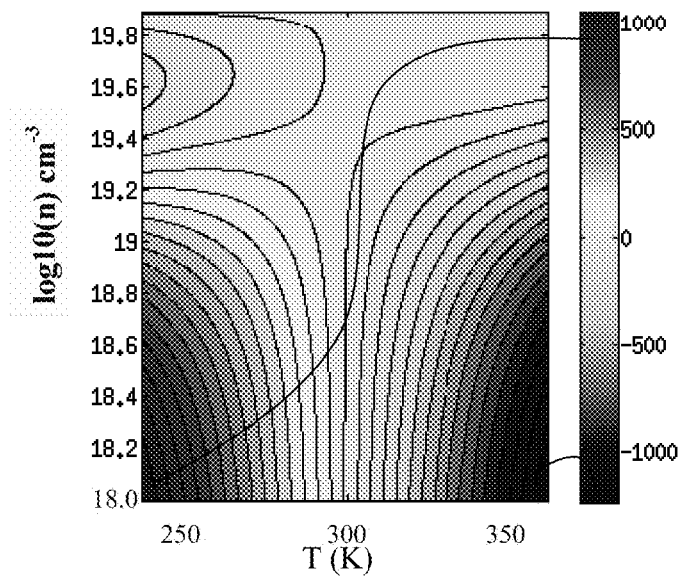
Figure 5B:
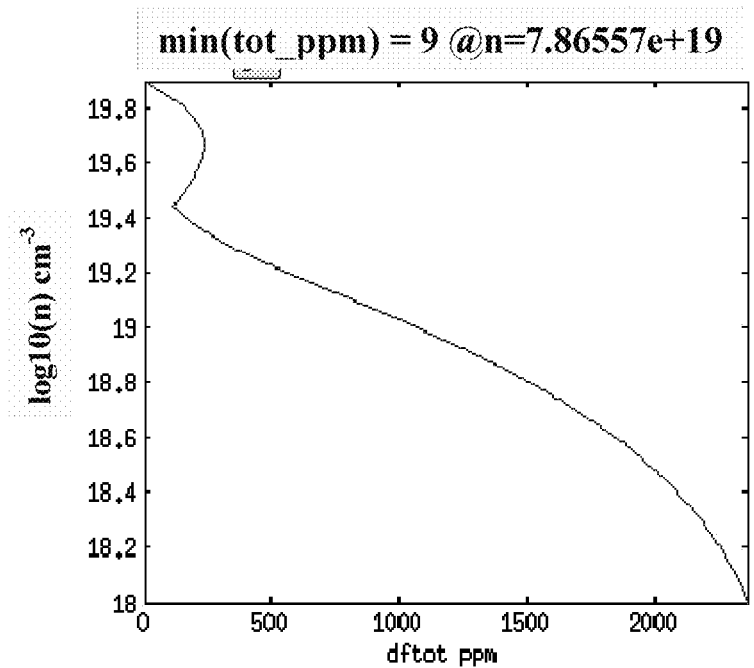
Figure 5C:
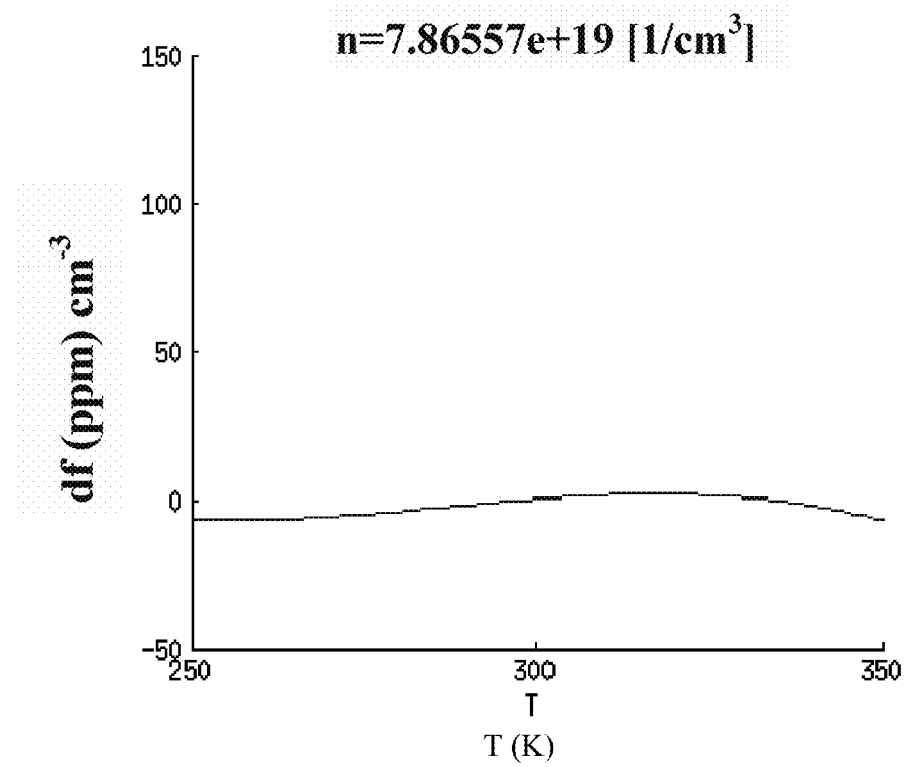

It is beneficial if lower n-dopant densities can be used for the superlattice. FIGS. 5a-5c show graphs corresponding to those of FIGS. 4a-4c and 3a-3c but using an superlattice with the following design parameters:

$$n_a=7.87e19\ cm^{-3}, p_a=0.639 \text{(about 64\%)}$$

$$n_b=1e18\ cm^{-3}, p_b=0.361 \text{(about 36\%)}$$

This configuration decreases the total frequency variation from 100 ppm to 9 ppm over a 100° C. range, which is not as good as above but achieved with a significantly lower concentration level.

Superlattice Configuration Example 3

Beam Resonator in Extensional or Flexural Mode

The examples above show that the Lamé mode resonator temperature drift can be reduced by using the n-doped silicon superlattice. In a similar manner the invention can be applied to beam resonators with an extensional or flexural resonance mode.

The temperature drift of such a resonance mode can be minimized, e.g., with a superlattice stack of $$n_a=1.03e20\ cm^{-3}, p_a=0.733 \text{(about 73\%)}$$

$$n_b=9e18\ cm^{-3}, p_b=0.267 \text{(about 27\%)}$$

Figure 6A:
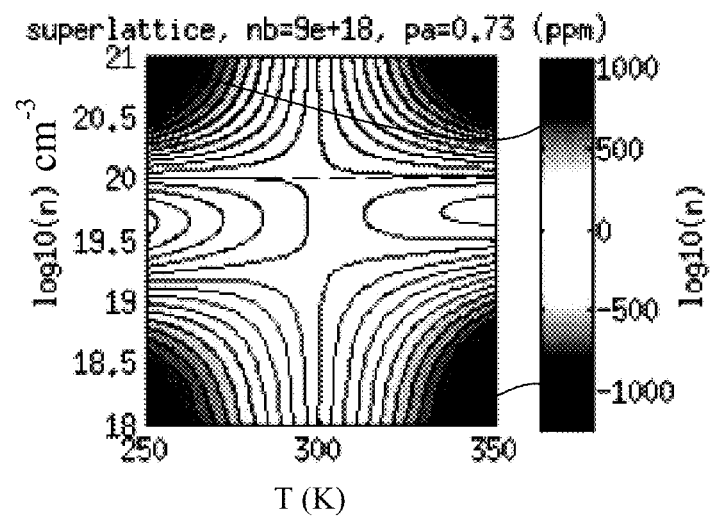
Figure 6B:
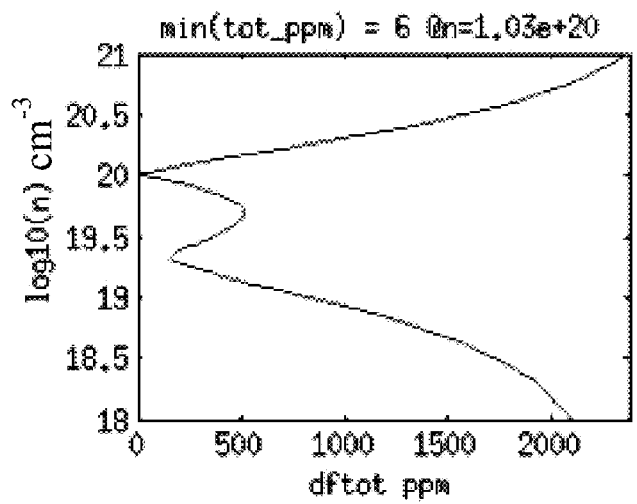
Figure 6C:
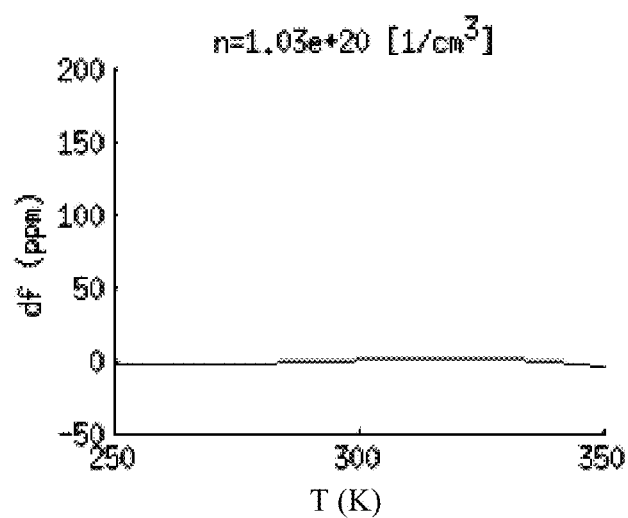

FIGS. 6a-6c show graphs corresponding to those of FIGS. 3-5 for this case. The calculated total frequency drift is 6 ppm over a 100° C. range.

Similarly, suitable frequency drift-minimizing design parameters can be found for beam resonators in a torsional resonance mode as well.

Superlattice Configuration Example 4

Plate Resonator in Lamé Mode

This example demonstrates that the effect can be applicable to a superlattice, where the region with lower n-dopant concentration (material "b") is "non-doped" or relatively weakly doped silicon, so that a resonator of material "b" alone would have a 1st order temperature coefficient of the order of −30 ppm/° C. Material "b" elastic matrix elements $c_{ij}$ values as a function of temperature have been calculated using data from C. Bourgeois et al., "Design of resonators for the determination of the temperature coefficients of elastic constants of monocrystalline silicon," in *Frequency Control Symposium, 1997, Proceedings of the 1997 IEEE International*, 1997, 791-799. Material b is assumed to be n-type phosphorus doped silicon with resistivity of 0.05 Ωcm, which corresponds to phosphrorus concentration of less than $3*10^{17}$ cm$^{-3}$. Material "a" properties are calculated through theory presented in below in a theory section.

In the optimal configuration, material "a" n-dopant concentration is $n_a$=7.50e19 cm$^{-3}$, and the relative amounts of materials a and b are $p_a$=0.68 (68%) $p_b$=0.32 (32%), respectively.

Figure 7A:
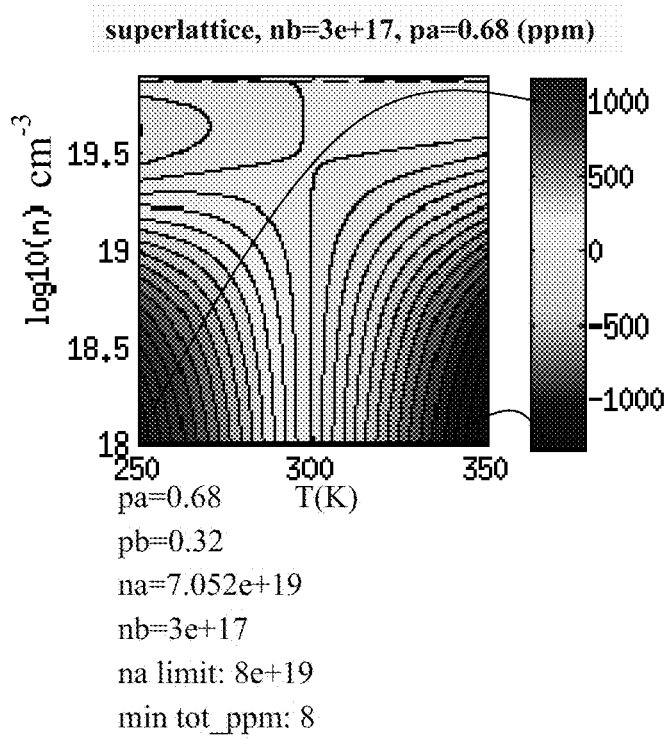
FIGS. 7d and 8d show frequency vs. temperature graphs for regions and superlattices according to some embodiments of the invention.
Figure 7B:
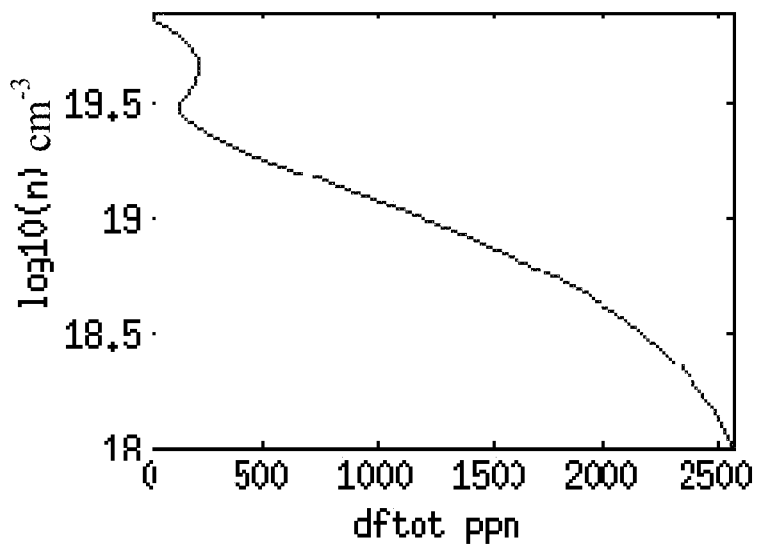

FIGS. 7a-7c show graphs corresponding to those of FIGS. 3-6 for this case. The total frequency drift is 8 ppm over a 100° C. range.

FIG. 7d illustrates the individual contributions from materials "a" and "b", and show the superlattice temperature dependence in detail. Titles in the figure include the temperature coefficients to third order.

Supported by the result of this example, in addition to the simulated weakly n/p-doped crystalline silicon materials calculated in the example, material "b" can also be polycrystalline silicon, which is known to have a linear TCF of approximately −30 ppm/C.

Superlattice Configuration Example 5

Plate Resonator in Lamé Mode

This example is similar to example 4 above, with the exception of material b being relatively weakly p-doped instead of weak n-doping. Again, material "b" temperature coefficient is approximately −30 ppm/C. Material b elastic matrix elements c_ij values as a function of temperature have been calculated using data from C. Bourgeois et al. Material b is assumed to be p-type boron doped silicon with resistivity of 4 Ωcm, which corresponds to boron concentration of less than $1*10^{16}$ cm$^{-3}$. Material "a" properties are calculated through theory presented in a theory section.

In the optimal configuration, material "a" optimal n-dopant concentration is $n_a$=7.15e19 cm$^{-3}$, and the relative amounts of materials "a" and "b" are $p_a$=0.68 (68%) $p_b$=0.32 (32%), respectively.

Figure 8A:
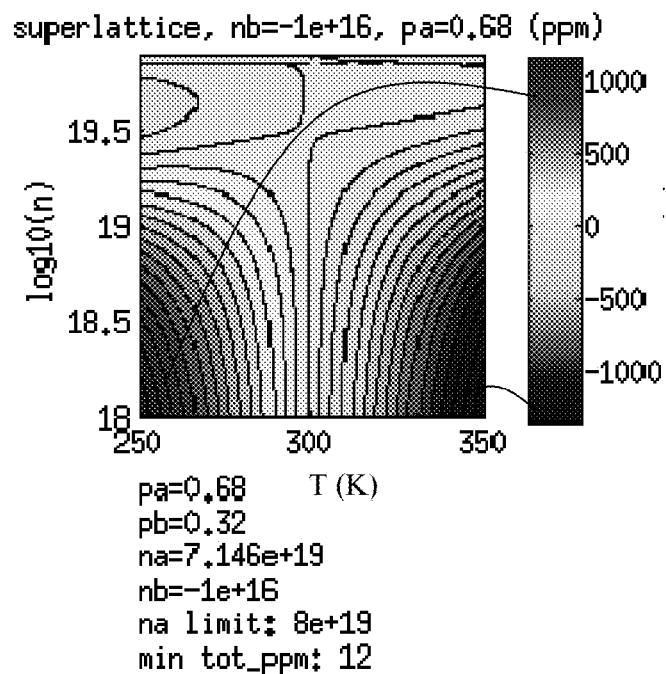
Figure 8B:
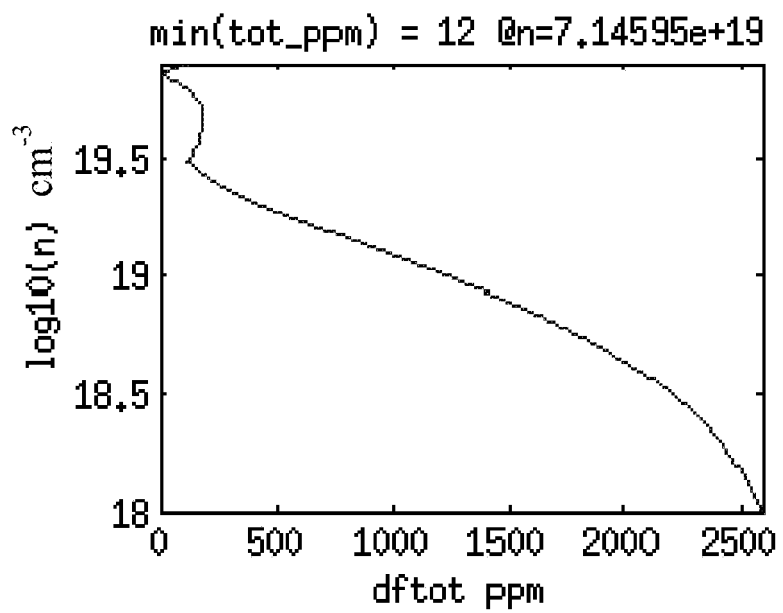

FIGS. 8a-8c show graphs corresponding to those of FIGS. 3-7 for this case. The total frequency drift is 8 ppm over a 100° C. range.

FIG. 8d illustrates the individual contributions from materials "a" and "b", and show the superlattice temperature dependence in detail. Figure titles include the temperature coefficients to third order.

Superlattice Configuration Example 6

Plate Resonator in Lamé Mode with Thermal Expansion Effect

In all previous examples the thermal expansion effects have been neglected. As discussed in section "Theoretical model for the linear TCF of a resonator" below, a contribution to resonator TCF comes from thermal expansion. This example illustrates what happens to the optimal superlattice configuration, when thermal expansion effects are taken into account. Thermal expansion coefficients as reported in C. Bourgeois et al, up to 2nd order, have been used in the calculation.

Figure 9A:
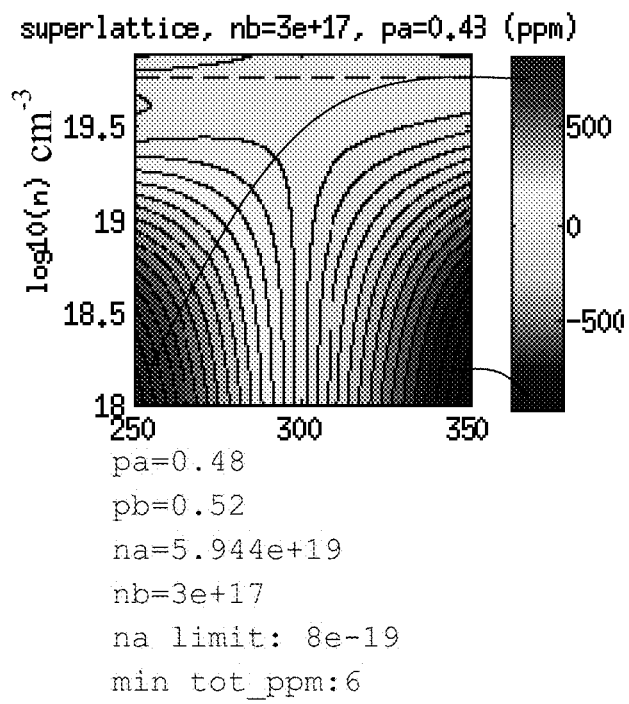
Figure 9B:
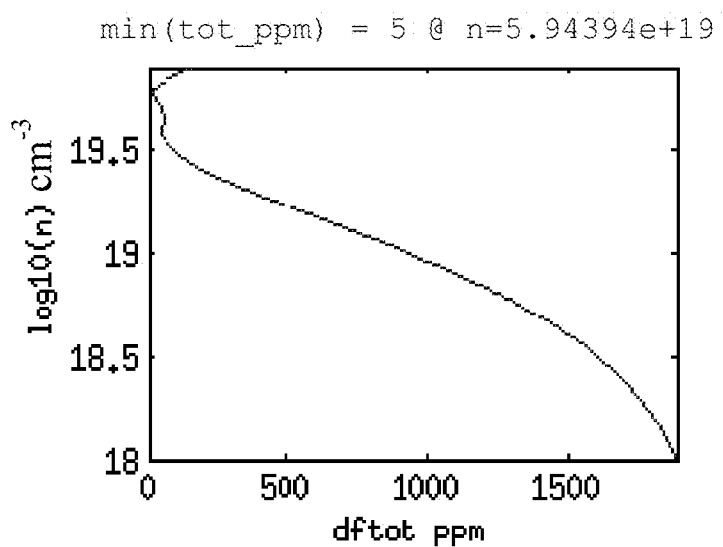
Figure 9C:
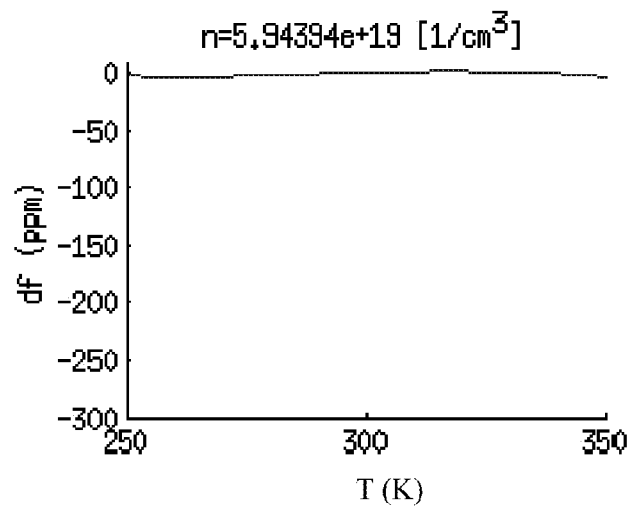

FIGS. 9a-c shows the result for an example that is similar to that of FIGS. 7a-c (example 4), with the exception that the thermal expansion effect is taken into account.

It is notable that the optimal superlattice configuration is changed from ($n_a$=7.50e19 cm$^{-3}$, $p_a$=0.68, $p_b$=0.32) to ($n_a$=5.94e19 cm$^{-3}$, $p_a$=0.48, $p_b$=0.52), which produces 5 ppm total frequency drift on a 100° C. temperature range.

This example demonstrates that the invention can be used to remarkably reduce overall frequency drift of a resonator to the claimed range despite the effect of thermal expansion, by finding suitable supperlattice parameters may change though. Generally speaking, in a two-material superlattice, if the material type having a larger n-doping concentration than the other of material type forms at least 35% of the total volume of the semiconductor element, this condition can be fulfilled.

Superlattice Configuration Example 7

Plate Resonator in Lamé Mode, Finite Element Method Simulation

A finite element method modal analysis for a 320×320×15 um silicon plate was performed to confirm the validity of example 2. The plate was modelled to consist of a vertical stack of two regions, region A being the bottom layer of thickness $p_a$*15 um and having a dopant concentration $n_a$, and region B being the top layer of thickness $p_b$*15 um and having a dopant concentration $n_b$. Plate sides were aligned along the [100] crystal directions.

Comsol multiphysics was used for the simulations. The analysis was performed for various temperatures (T=250 . . . 350K), and the stiffness matrix elements $c_{ij}$ were calculated for materials A and B at each temperature according to theory described below in theory section Using exactly same parameters as in example 2, i.e. $n_a$=7.87e19 cm$^{-3}$, $p_a$=0.639, $n_b$=1e18 cm$^{-3}$ and $p_b$=0.361, yields a frequency variation as a function of temperature that the very well corresponds that calculated in example 2.

Figure 10:
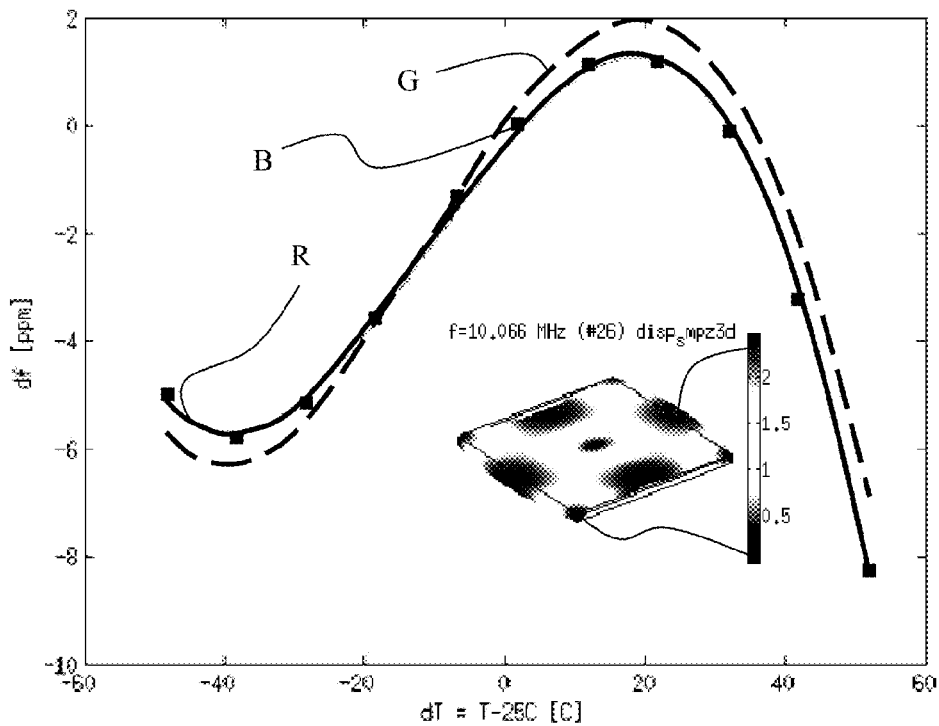
FIGS. 10-14 show the frequency difference in ppm as a function of temperature for further embodiments and examples of the invention.

FIG. 10 shows the frequency difference in ppm as a function of temperature. Blue points (B) show simulated data. Red curve (R) show 3rd order polynomial fitted to the simulation data. Green curve (G) show data calculated in example 2. The very minor difference may have occurred due to numerical inaccuracy (maximum FEM mesh element size was 50×50×5 um) and also due to the fact that the resonance mode may be slightly perturbed due to non-symmetric (in the thickness directions) stack formed by materials A and B.

Superlattice Configuration Example 8

Figure 11:
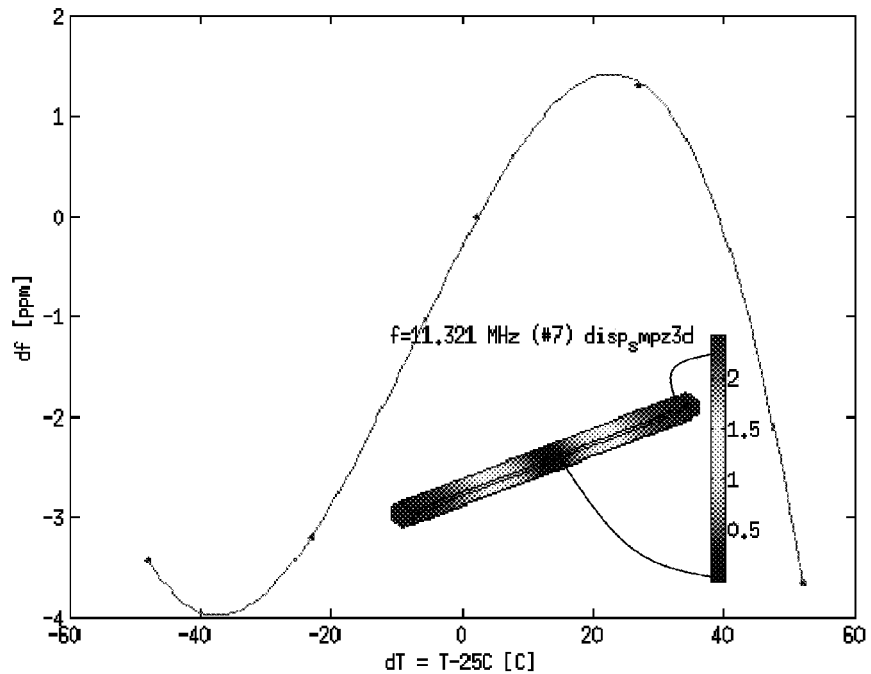

Beam Resonator in Length-Extensional Mode, Finite Elements Method Simulation In a similar way as example 7, the length extensional resonance mode of a beam resonator of dimensions of 320*20*15 um (sides aligned with [100] crystal direction) was simulated. FIG. 11 shows the frequency variation in ppm units, which is in agreement with the result of example 2. Superlattice parameters were $n_a$=1.03e20 cm$^{-3}$, $p_a$=0.733, $n_b$=9e18 cm$^{-3}$, $p_b$=0.267 (as in example 2).

Superlattice Configuration Example 9

Beam Resonator in In-Plane Flexural Mode, Finite Elements Method Simulation

Figure 12A:
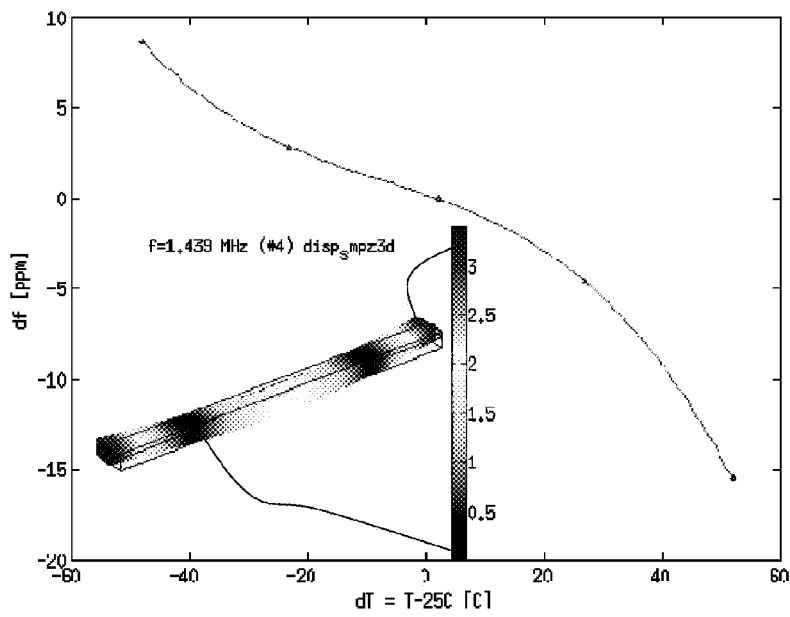

The in-plane flexural (bending) resonance mode of the beam resonator of example 8 was simulated. Since the dependence of the resonance frequency on the $c_{ij}$ parameters is slightly different from the length extensional resonance mode of example 8 (discussed in the context of FI 20115151, somewhat larger (25 ppm over a 100° C. range) frequency drift is observed, when superlattice parameters are similar to those in example 8 (FIG. 12a).

Figure 12B:
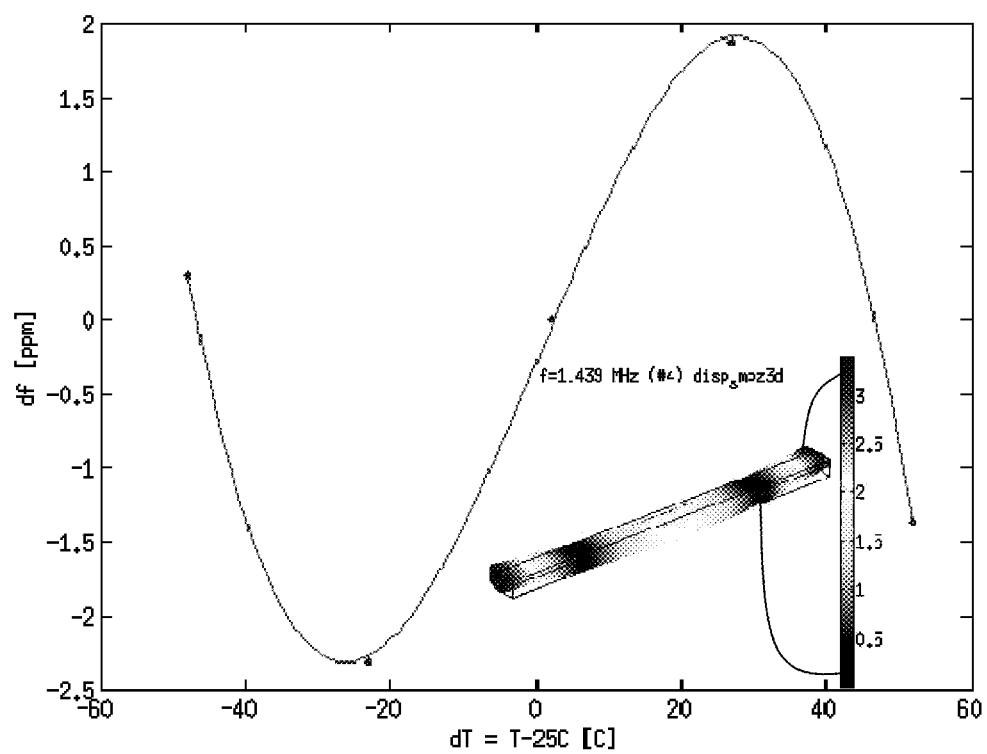

However, a more optimal superlattice configuration is obtained by increasing material A relative amount slightly: when the superlattice parameters are $n_a$=1.03e20 cm$^{-3}$, $p_a$=0.75, $n_b$=9e18 cm$^{-3}$, $p_b$=0.25, a total frequency drift of 5 ppm is reached on a 100° C. range (see FIG. 12b).

Superlattice Configuration Example 10

Figure 13A:
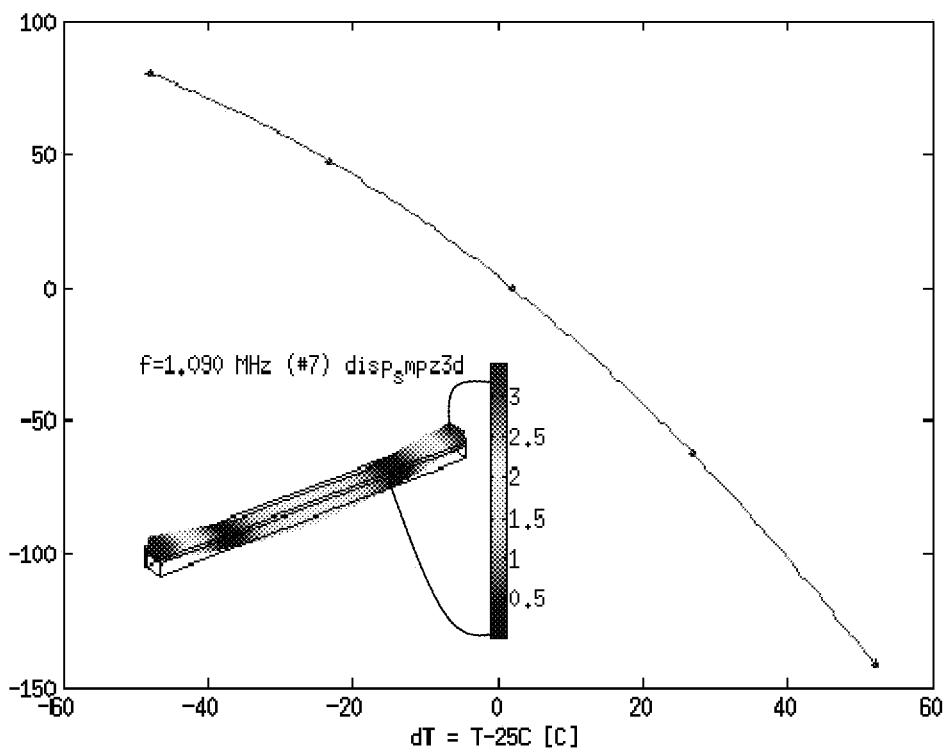

Beam Resonator in Out-of-Plane Flexural Mode, Finite Elements Method Simulation The out-of-plane flexural (bending) resonance mode of the beam in examples 8 and 9 is investigated in this example. In this case the analytical method of calculating the effective material resonance frequency is not valid any more, as discussed in section "Averaging effect". When superlattice parameters from example 9 are used the frequency drift remains at over 200 ppm level (FIG. 13a).

Figure 13B:
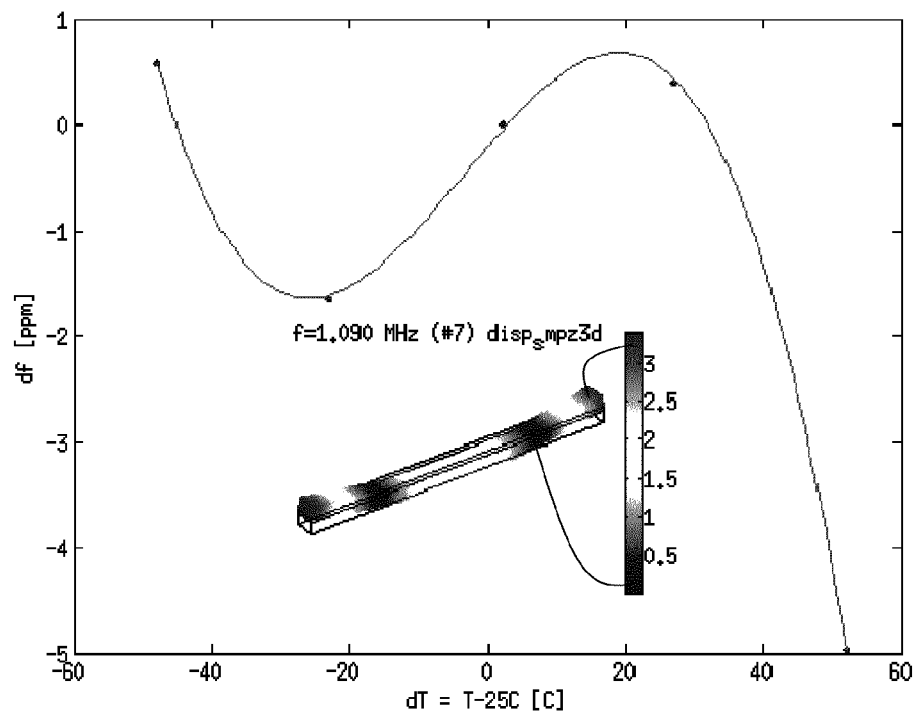

A more optimal superlattice configuration is $n_a$=1.03e20 cm$^{-3}$, $p_a$=0.89, $n_b$=9e18 cm$^{-3}$, $p_b$=0.11. With these parameters a 6 ppm frequency drift is reached on a 100° C. range (FIG. 13b).

Superlattice Configuration Example 11

Beam Resonator in Torsional Mode, Finite Elements Method Simulation

A beam resonator in a torsional resonance mode was simulated in the same manner as previous examples. Beam lateral dimensions were 320×20 um and its thickness was 10 um. The sides were oriented along the [110] directions; the normal defining the thickness direction was [100].

Figure 14:
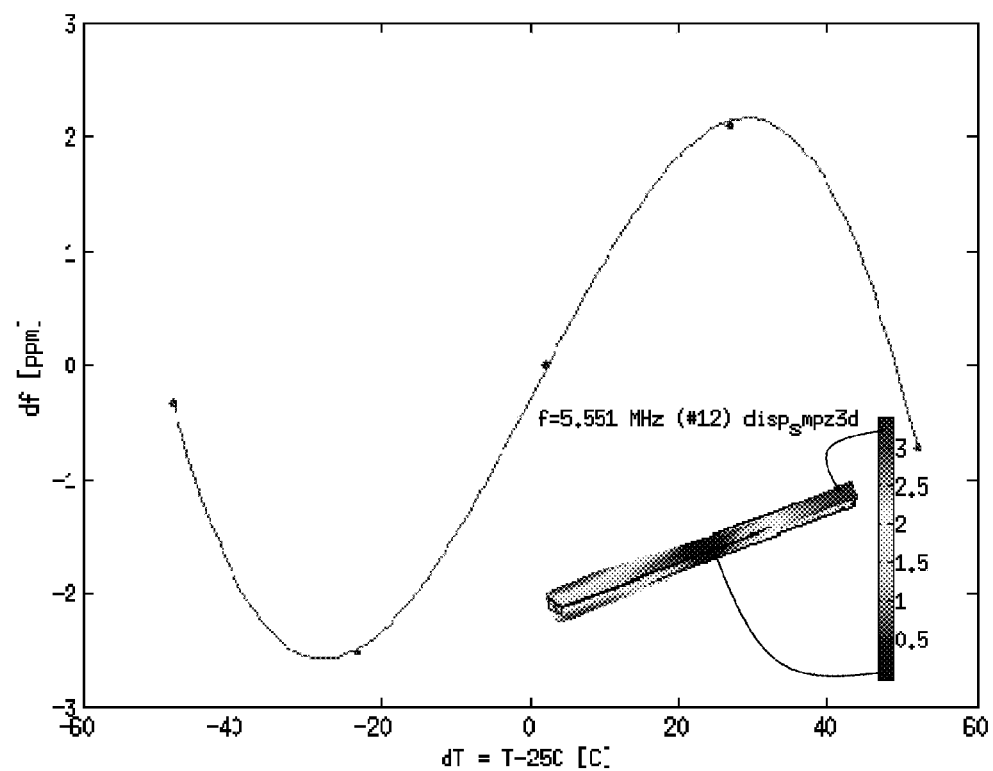

With superlattice configuration $n_a$=1.03e20 cm$^{-3}$, $p_a$=0.90, $n_b$=9e18 cm$^{-3}$, $p_b$=0.10, a frequency drift of 5 ppm was reached on a 100° C. range (FIG. 14).

VARIATIONS OF THE INVENTION

Variations

The examples above act as to prove the viability of the invention. There is an endless set of different types of layer combinations of the temperature-drift-minimizing superlattices for various resonator designs and resonance modes which fall within the scope of the invention. For example,
- one could use more than two n-concentrations for the layers,
- there is freedom in choosing layer the thicknesses and the order of layers,
- the superlattice does not have to be a discrete stack (for example, n-concentration can be continuously varied as a function of the thickness),
- the superlattice may have periodicity in two dimensions (for example, there may be an array of local regions of one material type in another material type in the wafer plane),
- one or some of the regions may be non-doped or p-doped, in particular p$^-$-doped (n<10$^{16}$ cm$^{-3}$).

The frequency vs. temperature response of the resonator can be tailored also with a different optimization target than the temperature drift minimization. For example, in the case of a piezoactivated resonator the objective can be to outcompensate the contribution of the non-silicon (piezomaterial+ related metals) parts to the frequency drift. In such a case, the non-silicon parts are also covered by the term resonator element, as they affect the resonance frequency and resonate with the element.

The principles of the invention can be applied not only to resonators but to any micromechanical device other than a resonator (e.g. accelerometer, gyroscope) that contains one or more springs that are an integral part for the device functionality and that experience flexure, extension, torsion in the device's operation mode. This is because the temperature drift of the stiffness k of any spring experiencing extension, bending or torsion can be reduced by using an n-doped superlattice. Therefore, the invention can be applied for any MEMS device whose performance depends on such springs.

Also, the effective material does not have to be a superlattice, i.e. a repeating structure. Instead of that, some other layer configurations can be used too, provided that they form a coupled spring system and the slopes of the temperature sensitivities suitably match at each point of the desired temperature range.

Theory

Theoretical investigations provide additional support for the invention. Below, some models which can be used to explain the abovementioned examples are briefly introduced.

Averaging Effect

Let us first consider a resonator made of a vertical-stack superlattice. The resonator is assumed to resonate in a resonance mode whose frequency is thickness independent. This assumption holds, e.g. for the Lamé resonance mode of a plate resonator, and approximately it holds for the square extensional mode of a plate resonator as well as for a width-extensional/length-extensional resonance mode of a beam resonator.

Figure 17:
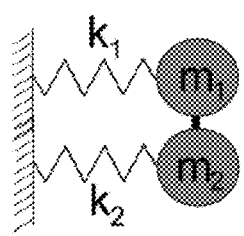

In general, a resonator can be described as a spring-mass system (k,m). Consequently, a resonator made of a silicon superlattice $n_1/n_2$ can be modelled as a system of two rigidly coupled spring-masses $(k_1,m_1)$ and $(k_2,m_2)$, see FIG. 17. In this approach the lumped model parameters $k_i$, $m_i$ represent the contribution from all layers of type i of the superlattice stack.

Since parallel springs are added together, it holds that the compound resonator frequency is the weighted rms sum of the "virtual" resonator frequencies:

$$(2\pi f_{total})^2 = \frac{k_{total}}{m_{total}} = \frac{k_1 + k_2}{m_1 + m_2}$$
$$= \frac{k_1}{m_1}(m_1/m_{total}) + \frac{k_2}{m_2}(m_2/m_{total})$$
$$= p_1(2\pi f_1)^2 + p_2(2\pi f_2)^2$$
$$\Rightarrow$$
$$f_{total} = \sqrt{p_1 f_1^2 + p_2 f_2^2},$$

where the weights $p_i$ are the relative amounts of materials 1 and 2, respectively.

The result can be generalized for a case of an arbitrary amount of different layers, i.e., there can be more than two types of layers:

$$f_{total} = \sqrt{\Sigma p_i f_i^2}$$

Further, the result can be formulated for continuous profiles:

$$f_{total} = \sqrt{\frac{1}{d} \int_{z=0}^{z=d} f^2(z) dz}$$

where f(z) is the frequency of the infinitesimally thin "virtual resonator" of thickness dz and d is the total thickness of the resonator.

Examples 1-6 above have been calculated analytically using the above described root-mean-square averaging formula. The validity of the method can be verified by comparing example 2 with example 7 (plate resonator Lamé mode), and by comparing example 3 with example 8 (beam resonator length extensional mode), where the agreement with finite element simulation results is found to be very good.

If the resonance mode is such that its frequency is not thickness independent and/or if the effective material is not based on a vertical superlattice stack (superlattice can be lateral, or, in general the regions with different dopant concentrations can form a very unrestricted geometrical arrangement in two or three dimensions), the above discussed root-mean-square averaging formula is not valid any more. In such cases, different regions within the resonator body contribute with different weights to the generalized stiffness of the resonator. An example of such a case is the out-of-plane flexural (bending) resonance of a beam resonator: volume elements near the top/bottom surface of the beam have a larger effect on the generalized stiffness of the resonator than central volume elements.

In these cases, the general approach of cancelling positive/ negative temperature coefficients (of first and higher order) with suitably selected dopant concentrations and relative volumes, and, possibly, suitably selected arrangement of the regions, is still applicable. Those optimal configurations can be found e.g. by finite element simulations. Examples 7-11 show such FEM simulated configurations for certain resonance modes.

Theoretical Model for the Linear TCF of a Resonator

The frequency of a resonator can be given in a generalized form by $$f = \frac{1}{L} \times \sqrt{\frac{c}{\rho}},$$

where c is the generalized stiffness of the material (which takes into account the resonance mode, resonator geometry and its orientation with respect to crystal), ρ is the material density and L is the generalized dimension of the resonator.

Generalized stiffness is a function of elastic parameters (stiffness constants) $c_{11}$, $c_{12}$, $c_{44}$. Its functional form varies according to the resonance mode, resonator geometry and its orientation with respect to the crystal. c can be interpreted as the effective spring constant of a specific resonance mode. Exact analytical expressions exist only for very few modes, such as for the Lame mode for a rectangular plate with sides aligned with the 100 directions: c is given by c11-c12

Lame mode for a rectangular plate with sides aligned with the 110 directions: c is given by c44.

When the temperature changes the resonance frequency changes due to change in material parameters and in the dimensions of the resonator. The temperature coefficient of the resonance frequency $$TC_f = \frac{1}{f} \frac{df}{dT}$$

depends on material parameters on the following way:

$$TC_f = TC_v - \alpha,$$

where α is the linear coefficient of thermal expansion taking into account the elongation of the resonator and TC of acoustic velocity is $$TC_v = \frac{1}{v} \frac{dv}{dT} = \frac{1}{2}(TC_c - TC_\rho) = \frac{1}{2}(TC_c + 3\alpha),$$

leading to $$TC_f = \frac{1}{2}(TC_c + \alpha)$$

Usually the clearly dominating effect is the first term, i.e. thermal coefficient of stiffness $TC_c$, whereas thermal expansions effect is much smaller. If one is able to modify $TC_c$ of the resonating material strongly enough, temperature stable resonators can be realised.

Elastic Constant Temperature Dependencies as a Function of Temperature

The authors have theoretically modelled the free electron contribution to the elastic constants ($c_{11}$, $c_{12}$, $c_{44}$) of silicon using the many-valley approach by Keyes (R. W. Keyes, Solid State Physics, Vol. 20, 1967). The model contains a single fitting parameter, the uniaxial deformation potential $\Xi_u$. This parameter was fitted to the data published by Hall ("Electronic Effect in the Elastic Constants of n-Type Silicon", Physical Review, vol 161 (2), pp. 756-761, 1967) using the data points at temperature range T=100 . . . 308 K. The fit gave $\Xi_u$=9.6 eV. For the density of states mass we use the standard value $m_{de}$=0.32*$m_e$ ($m_e$ being the electron rest mass).

In FI 20115151 the theory was used to explain the minimization of the linear TCF of a resonator: for a suitable resonator geometry and a certain resonance mode, the linear TCF could be made zero with an optimal level of n-dopant concentration.

Now, the theory is used to explain the minimization of temperature drift on a wider range because of compensation of higher order temperature sensitivity effects.

Figure 15A:
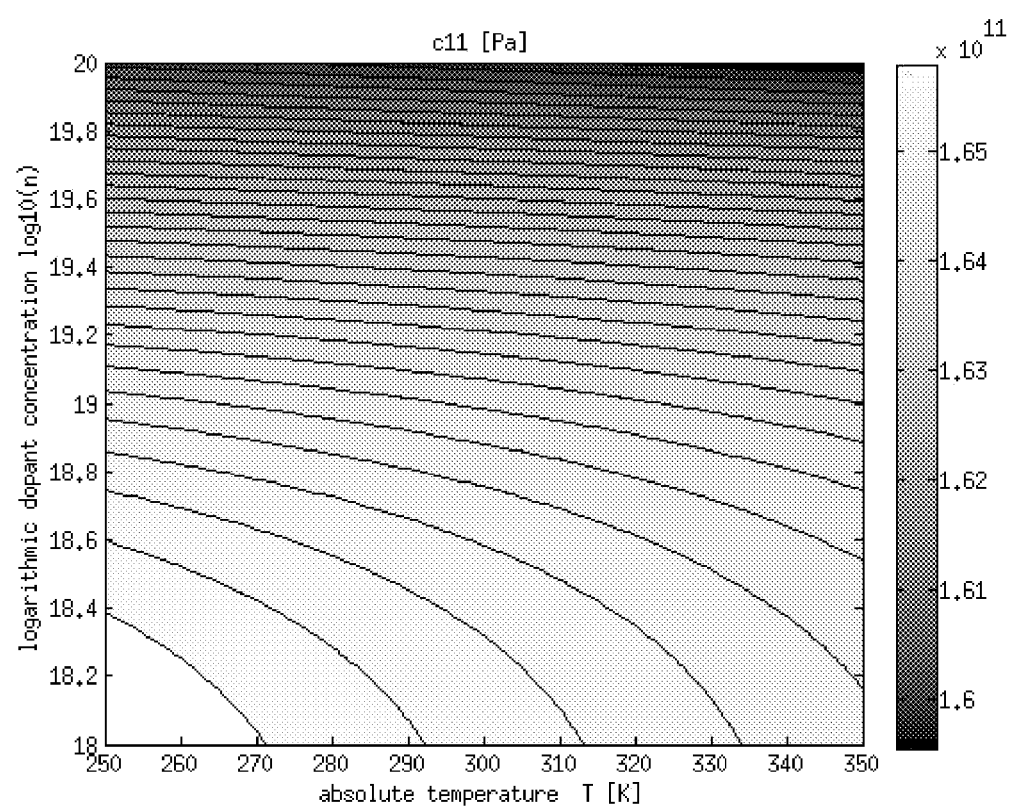
FIGS. 15-17 show graphs and schemes supporting theoretical studies carried out for supporting the invention.
Figure 15B:
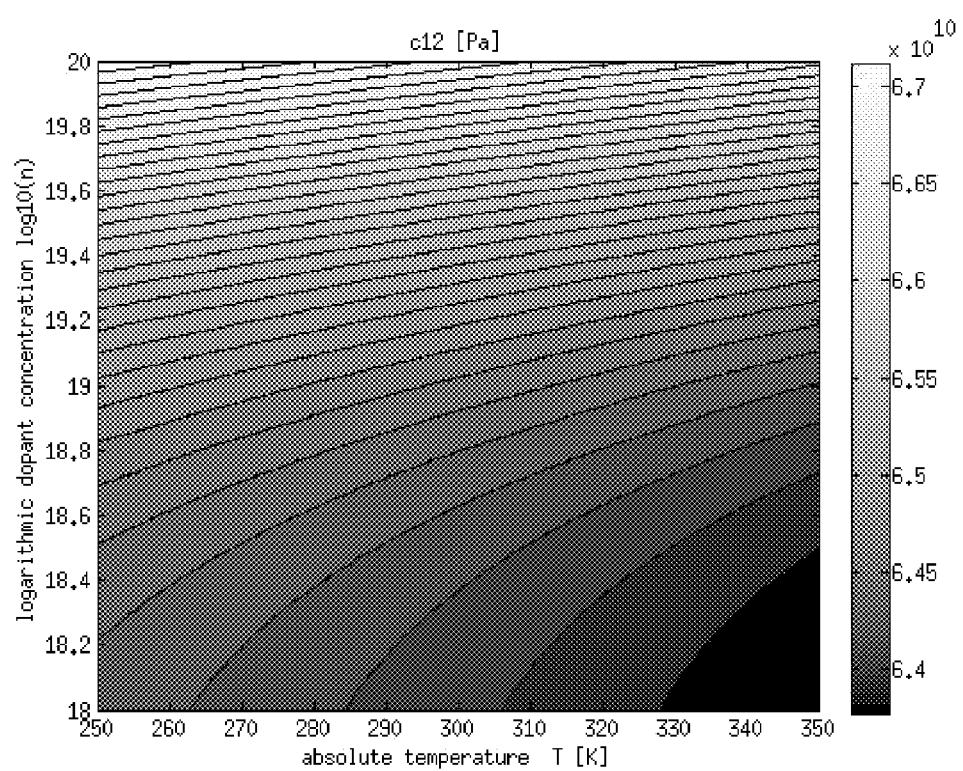
Figure 15C:
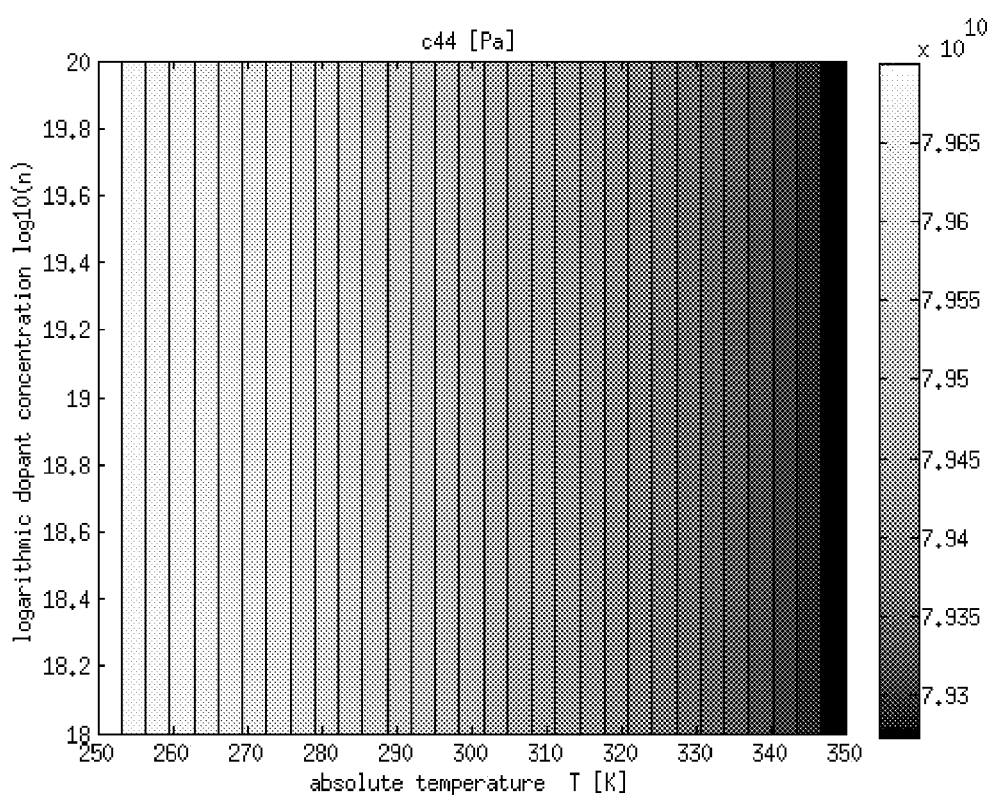

FIGS. 15a-c show the behavior of silicon elastic constants ($c_{11}$, $c_{12}$, $c_{44}$) as a function of dopant concentration and temperature. Elastic constant values have been calculated for absolute temperature range T=250 . . . 350K, and for dopant concentrations n=1e18 . . . 1e20 l/cm$^3$.

Importantly for temperature compensation, there are certain resonance modes, whose frequency is strongly dependent on the difference term $c_{11}$-$c_{12}$ (such modes are discussed more in FI 20115151; examples of these modes are the Lame mode of a square-shaped plate and extensional/torsional modes of a beam). The difference $c_{11}$-$c_{12}$ is plotted in FIG. 16a.

Figure 16A:
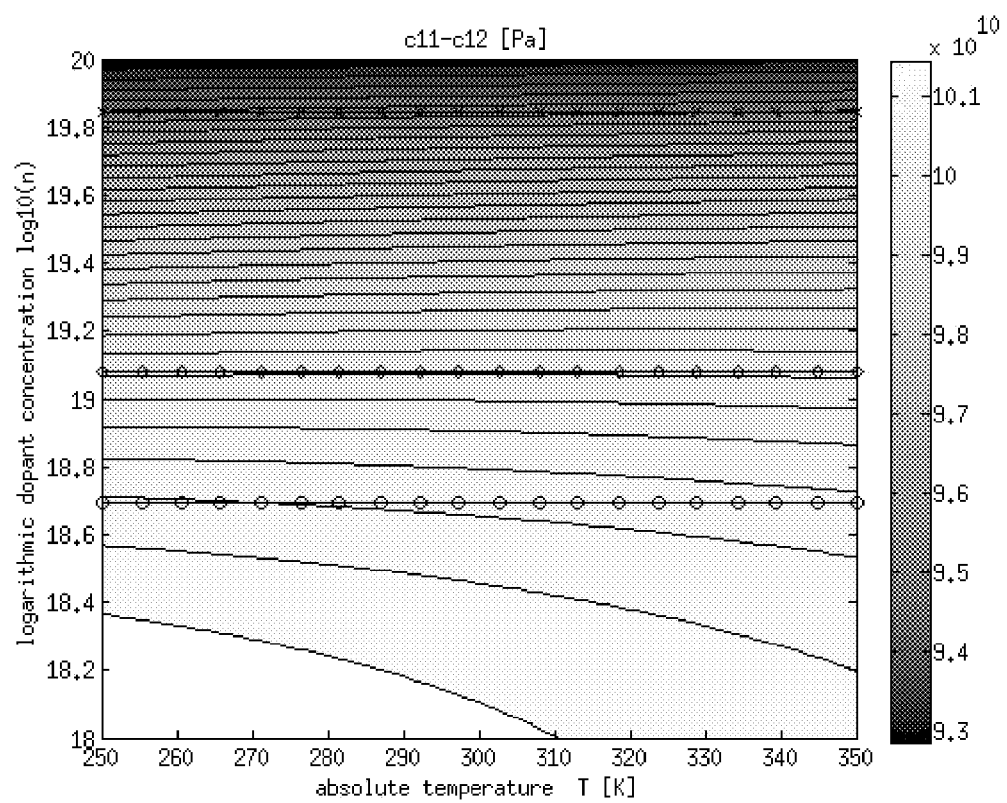
Figure 16B:
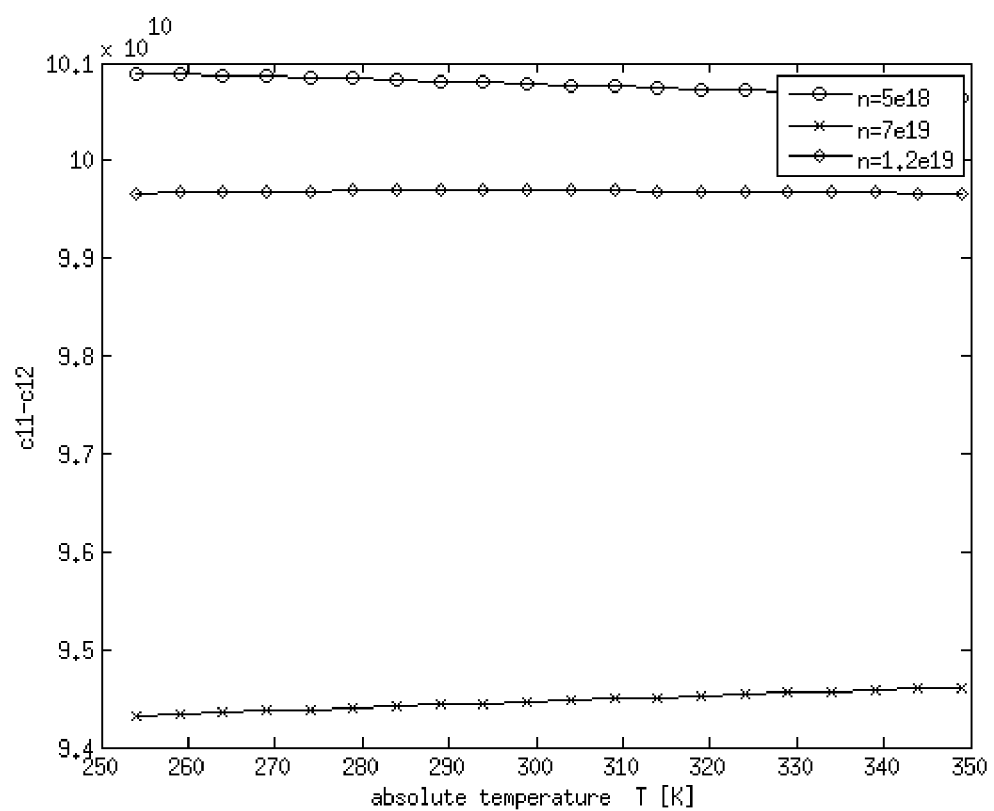

It turns out that depending on the dopant concentration, $c_{11}$-$c_{12}$ may be an increasing or decreasing function of temperature. Examples of such cases are illustrated by the lines with marked with circles/crosses in FIG. 16a and in FIG. 16b: with n=5e18/cm$^3$ $c_{11}$-$c_{12}$ is a decreasing function, and with n=7e19/cm$^3$ $c_{11}$-$c_{12}$ is increasing with temperature. At intermediate concentrations the contours in FIG. 16a are almost parallel to x-axis, which means that variation of $c_{11}$-$c_{12}$ is relatively small as a function of temperature—this is illustrated by the line marked with diamonds in FIGS. 16a and 16b corresponding to n=1.2e19/cm$^3$. In terms of linear TCF at such a concentration value the TCF is zero (TCF is defined as the slope of the curve at T=25C i.e. at T=298K).

Figure 16C:
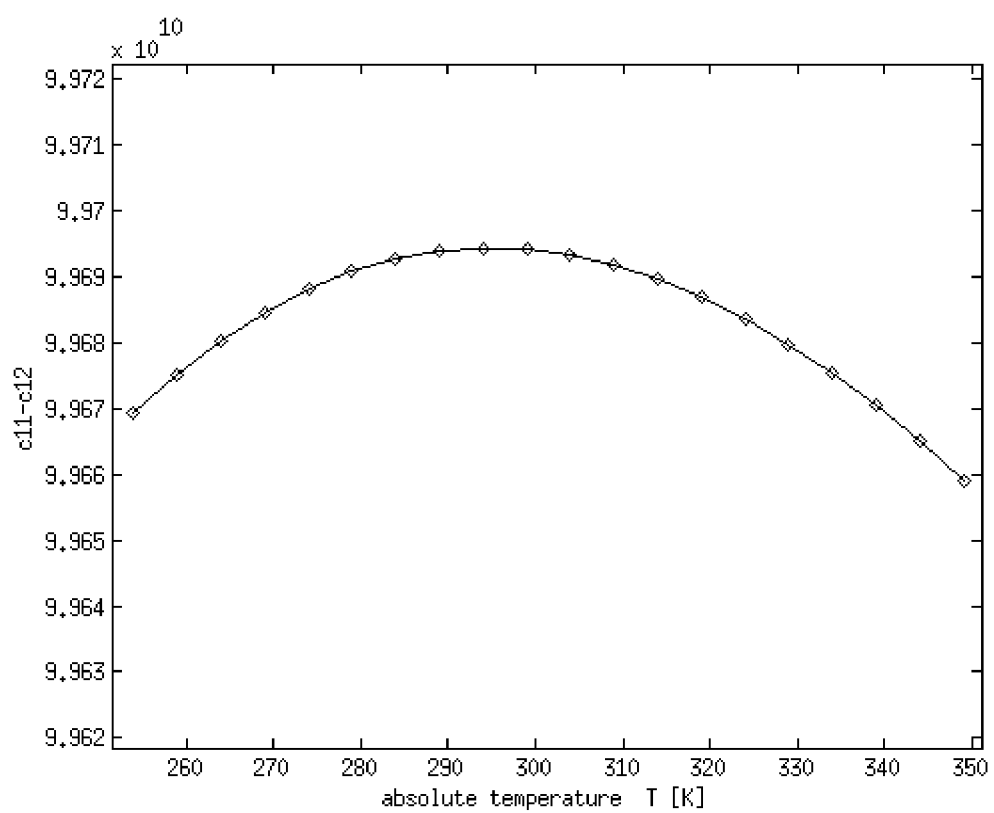

However, even at this optimal point there is considerable nonlinear behavior left, which leads to change of $c_{11}$-$c_{12}$ as a function of temperature. This is well observable in FIG. 16c, which is a zoomed-in version of FIG. 16b. As a result, it appears that with constant dopant concentration the frequency drift of resonance mode which is strongly dependent on the $c_{11}$-$c_{12}$ term would be more than 100 ppm over a 100° C. temperature range even when the dopant concentration is optimal.

The theory confirms the functionality of the invention. Two (or more) regions of differently doped regions of silicon can act together in such a manner that the temperature behavior of the resulting compound/effective material is the weighted sum of its constituents.

Figure 16D:
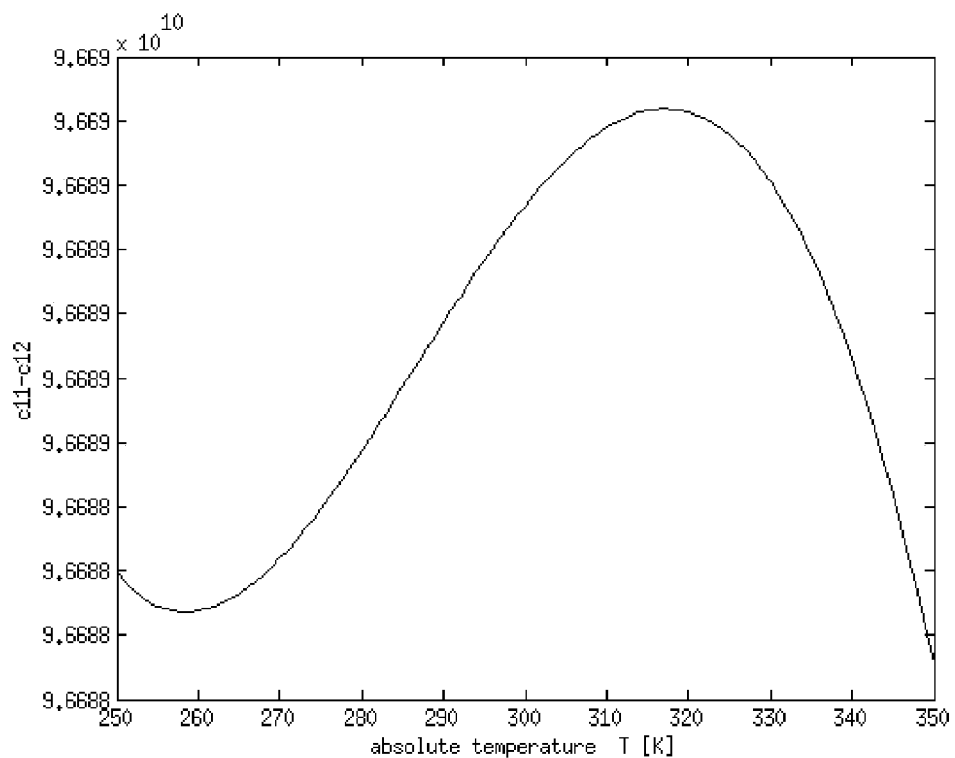

FIG. 16d shows the $c_{11}$-$c_{12}$ vs. temperature behavior of an example of an effective material, which consists of a 63.9% contribution of n=7.87e19/cm$^3$-doped material and 36.1% contribution from n=1e18/cm$^3$-doped material. It has been assumed that elastic matrix elements $c_{11}$ and $c_{12}$ for the effective material are given as weighted averages of the corresponding elastic matrix elements of the constituents, as discussed in more detail in section "Averaging effect".

The invention claimed is:

1. A micromechanical device comprising;
   a semiconductor element capable of deflecting or resonating and comprising at least two regions having different material properties,
   drive or sense means functionally coupled to said semiconductor element,
   wherein
   at least one of said regions comprises one or more n-type doping agents,
   the relative volumes, doping concentrations, doping agents and/or crystal orientations of the regions being configured so that
   the temperature sensitivities of the generalized stiffness are opposite in sign at least at one temperature for the regions, and
   the overall temperature drift of the generalized stiffness of the semiconductor element is 50 ppm or less on a temperature range of 100° C.

2. The device according to claim 1, wherein the at least one first region and at least one second region are distinct regions comprising different doping concentrations of the one or more n-type doping agents.

3. The device according to claim 1, wherein the at least one first region and at least one second region comprise different n-type doping agents.

4. The device according to claim 1, wherein the at least one first region and at least one second region comprise different crystal orientations.

5. The device according to claim 1, wherein the temperature sensitivities of the generalized stiffness of said regions are opposite in sign on a majority of said temperature range, preferably essentially throughout the entire temperature range.

6. The device according to claim 1, wherein the regions are configured so as to produce temperature drift of the generalized stiffness of the semiconductor element of 10 ppm or less on a temperature range of 100° C.

7. The device according to claim 1, wherein said regions are stacked on top of each other in a thickness direction of the semiconductor element.

8. The device according to claim 1, wherein said regions are arranged laterally with respect to each other in the semiconductor element.

9. The device according to claim 1, wherein said regions are arranged in the semiconductor element in a configuration periodically repeating in at least one dimension so as to form a superlattice structure.

10. The device according to claim 1, wherein said regions are arranged in the semiconductor element as a lateral two-dimensional array.

11. The device according to claim 1, wherein all said regions are doped with the same n-type doping agent with different concentration.

12. The device according to claim 11, wherein the doping concentration in one region is 5e19 cm$^{-3}$ or less and more than 5e19 cm$^{-3}$ in another region.

13. The device according to claim 11, wherein the doping concentration in one region is 2e19 cm$^{-3}$ or less and more than 2e19 cm$^{-3}$ in another region.

14. The device according to claim 1, wherein the type of regions having a larger n-doping concentration than the other of type of said regions forms at least 35% of the total volume of the semiconductor element.

15. The device according to claim 1, wherein the doping concentration in each of the regions is essentially homogeneous.

16. The device according to claim 1, wherein at least one of the regions is a silicon epitaxial layer.

17. The device according to claim 1, wherein at least one of the regions comprises a trench manufactured by trench refill process.

18. The device according to claim 1, wherein at least one of the regions is manufactrured by implantation and annealing process.

19. The device according to claim 1, wherein at least some of the regions have been bonded together by a wafer bonding technique.

20. The device according to claim 1, wherein the semiconductor element is a resonating element anchored to a supporting structure and the device comprises electrical drive means for exiting a resonance mode to the resonating element.

21. The device according to claim 20, wherein the resonating element is a plate and adapted to be excited with said electrical drive means to a mode selected from the group of
   a shear mode, such as a Lamé mode,
   square extensional (SE) mode,
   width extensional (WE) mode,
   flexural mode.

22. The device according to claim 20, wherein the resonating element is a beam and adapted to be excited with said electrical drive means to a mode selected from the group of
   extensional mode,
   flexural mode,
   torsional mode.

23. The device according to claim 1, comprising
one region type with a doping concentration of 5e19-2e20 cm$^{-3}$, this region type amounting to 35-75% of the total volume of the resonating element,
another region type being non-doped or having a doping concentration of less than 2e18 cm$^{-3}$, this region type amounting to 25-65% of the total volume of the resonating element.

24. The device according to claim 1, wherein the drive or sense means comprise piezoelectric drive and/or sense means arranged in mechanical contact with the semiconductor element.

25. The device according to claim 24, wherein the doping concentrations and or relative volumes of the region types are adapted so as to outcompensate the effect of the piezoelectric drive and/or sense means on the temperature coefficient.

26. The device according to claim 1, wherein
said first region has a negative temperature sensitivity of the generalized stiffness at a second temperature different from the first temperature,
said second region has a positive temperature sensitivity of the generalized stiffness at the second temperature.

27. The device according to claim 1, wherein said temperature region is centered around 25° C.

28. The device according to claim 1, wherein the semiconductor element is a resonator element aligned with the crystal matrix of the semiconductor material such that the resonator exhibits a resonator mode whose modal frequency is dominated by the elasticity term $(c_{11}-c_{12})$ of the semiconductor materials of the resonator element.

29. A method for designing a micromechanical device comprising
a semiconductor element capable of deflecting or resonating and comprising at least two regions having different material properties,
drive or sense means functionally coupled to said semiconductor element,
the method comprising
choosing a basic semiconductor material for the semiconductor element,
choosing at least one n-dopant to be added to the semiconductor material,
designing the inner structure of the semiconductor material,
wherein said designing of the inner structure comprises determining at least two n-dopants, n-dopant concentrations and/or crystal orientations of n-doped material, and their relative volumes in the distinct regions of the semiconductor element so that the overall temperature drift of the generalized stiffness of the semiconductor element is less than 50 ppm.

30. The method for designing a micromechanical device according to claim 29, wherein the determining is done so that the overall temperature drift of the generalized stiffness of the semiconductor element is less than 10 ppm on the temperature range of 100° C.

* * * * *